US010725682B2

(12) United States Patent
Kim et al.

(10) Patent No.: US 10,725,682 B2
(45) Date of Patent: Jul. 28, 2020

(54) MEMORY MODULES, MEMORY SYSTEMS AND METHODS OF OPERATING MEMORY MODULES

(71) Applicant: Samsung Electronics Co., Ltd., Suwon-si, Gyeonggi-do (KR)

(72) Inventors: Wang-Soo Kim, Seoul (KR); Jung-Hwan Choi, Hwaseong-si (KR); Ki-Duk Park, Seoul (KR); Yoo-Chang Sung, Hwaseong-si (KR); Jin-Sung Youn, Seoul (KR); Chang-Kyo Lee, Seoul (KR); Ju-Ho Jeon, Bucheon-si (KR); Jin-Seok Heo, Jeonju-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 156 days.

(21) Appl. No.: 16/103,078

(22) Filed: Aug. 14, 2018

(65) Prior Publication Data

US 2019/0179553 A1 Jun. 13, 2019

(30) Foreign Application Priority Data

Dec. 12, 2017 (KR) ........................ 10-2017-0170033

(51) Int. Cl.
*G06F 12/00* (2006.01)
*G06F 3/06* (2006.01)
(Continued)

(52) U.S. Cl.
CPC .......... *G06F 3/0632* (2013.01); *G06F 3/0604* (2013.01); *G06F 3/0679* (2013.01); *G11C 5/04* (2013.01); *G11C 29/022* (2013.01); *G11C 29/023* (2013.01); *G11C 29/028* (2013.01); *G11C 29/1201* (2013.01); *H04L 25/03057* (2013.01); *G11C 11/407* (2013.01); *G11C 29/44* (2013.01); *H01L 25/18* (2013.01)

(58) Field of Classification Search
None
See application file for complete search history.

(56) References Cited

U.S. PATENT DOCUMENTS 6,724,329 B2 4/2004 Casper
8,588,014 B1 11/2013 Fung et al.
(Continued)

OTHER PUBLICATIONS

Search Report issued by the Intellectual Property Office of Singapore dated Aug. 16, 2019 for Application No. SG 10201808919R.

*Primary Examiner* — Jason W Blust
(74) *Attorney, Agent, or Firm* — Harness, Dickey and Pierce, P.L.C.

(57) ABSTRACT

A memory module includes a plurality of semiconductor memory devices associated with a same module board. The plurality of semiconductor memory devices configured to simultaneously perform a training operation, the plurality of semiconductor memory devices including a reception interface circuit configured to perform the training operation to search for selected equalization coefficients of an equalizer based on a training pattern from a memory controller, and transmit a training information signal to the memory controller in a training mode in response to a training command from the memory controller, the training information signal including the selected equalization coefficients.

19 Claims, 22 Drawing Sheets

(51) Int. Cl.
- *H04L 25/03* (2006.01)
- *G11C 29/02* (2006.01)
- *G11C 5/04* (2006.01)
- *G11C 29/12* (2006.01)
- G11C 11/407 (2006.01)
- H01L 25/18 (2006.01)
- G11C 29/44 (2006.01)

(56) References Cited

U.S. PATENT DOCUMENTS

| | | |
|---|---|---|
| 9,087,615 B2 | 7/2015 | Cordero et al. |
| 9,536,626 B2 | 1/2017 | Schoenborn et al. |
| 9,728,236 B1 | 8/2017 | Sankaranarayanan et al. |
| 2004/0091070 A1* | 5/2004 | Kim ................ H04L 25/03057 375/350 |
| 2009/0300278 A1 | 12/2009 | Kruger |
| 2010/0185810 A1 | 7/2010 | Cline et al. |
| 2010/0325372 A1 | 12/2010 | Housty et al. |
| 2014/0092952 A1 | 4/2014 | Aguilar-Arreola et al. |
| 2014/0181339 A1 | 6/2014 | Hopgood et al. |
| 2014/0281192 A1 | 9/2014 | Gilda et al. |
| 2017/0083259 A1 | 3/2017 | Lee et al. |

* cited by examiner

FIG. 17

| MID | OEC | OCD |
|-----|-----|-----|
| ID1 | OEC1 | OCD1 |
| ⋮ | ⋮ | ⋮ |
| IDt | OECt | OCDt |

MEMORY MODULES, MEMORY SYSTEMS AND METHODS OF OPERATING MEMORY MODULES

CROSS-REFERENCE TO RELATED APPLICATION(S)

This application claims priority under 35 USC § 119 to Korean Patent Application No. 10-2017-0170033, filed on Dec. 12, 2017 in the Korean Intellectual Property Office (KIPO), the contents of which are herein incorporated by reference in their entirety.

BACKGROUND

1. Technical Field

Example embodiments relate to a memory device. For example, at least some example embodiments relate to memory modules, memory systems and/or methods of operating memory modules.

2. Description of the Related Art

A semiconductor memory may be a memory device that is implemented using a semiconductor such as silicon (Si), germanium (Ge), gallium arsenide (GaAs), indium phosphide (InP), or the like. Semiconductor memory devices are typically divided into a volatile memory device and a nonvolatile memory device.

A volatile memory device refers to a memory device in which stored data is lost when a power supply is shut down. On the other hand, a nonvolatile memory device refers to a memory device that retains stored data when a power supply is shut down. Because a dynamic random access memory (DRAM) that is a kind of volatile memory device has a high access speed, the DRAM is widely used as a working memory, a buffer memory, a main memory, and the like of a computing system. With the development of computing technologies, a demand on DRAM as a working memory of computing systems is increasing. Because a DRAM memory cell generally includes a capacitor and a transistor, it is difficult to reduce a cell size smaller than a constant level. Thus, it is difficult to implement a high-capacity DRAM within a limited area.

For implementing high-capacity, a plurality of DRAMs are provided in a form of a memory module. A training operation may be performed sequentially on the DRAMs to set the DRAMs to operate properly based on a result of the training operation.

SUMMARY

According to example embodiments, a memory module includes a plurality of semiconductor memory devices associated with a same module board, the plurality of semiconductor memory devices configured to simultaneously perform a training operation, the plurality of semiconductor memory devices including a reception interface circuit configured to, perform the training operation to search for selected equalization coefficients of an equalizer based on a training pattern from a memory controller, and transmit a training information signal to the memory controller in a training mode in response to a training command from the memory controller, the training information signal including the selected equalization coefficients.

According to example embodiments, a memory system includes a memory controller; and a memory module including a plurality of semiconductor memory devices, the plurality of semiconductor memory devices configured to simultaneously perform a training operation, the plurality of semiconductor memory devices including a reception interface circuit configured to, perform a training operation to search for selected equalization coefficients of an equalizer based on a training pattern received from the memory controller, and transmit a training information signal to the memory controller in a training mode in response to a training command from the memory controller, the training information signal including the selected equalization coefficients.

According to example embodiments, in a method of operating a memory module, the memory module including a plurality of semiconductor memory devices, the method including determining, by each of the semiconductor memory devices operating in a training mode, selected equalization coefficients of an equalizer based on a training pattern received from a memory controller; transmitting, by each of the plurality semiconductor memory devices, the selected equalization coefficients to the memory controller; and performing, by each of the plurality of semiconductor memory devices operating in a normal mode, a memory operation.

Accordingly, in a memory module including a plurality of semiconductor memory devices, the semiconductor memory devices simultaneously perform training to search for desired (or, alternatively, optimal) equalization coefficients and transmit training information signal including the desired (or, alternatively, optimal) equalization coefficients to a memory controller in a training mode. Therefore, the memory module including the semiconductor memory devices may greatly reduce time for the training.

BRIEF DESCRIPTION OF THE DRAWINGS

Illustrative, non-limiting example embodiments will be more clearly understood from the following detailed description in conjunction with the accompanying drawings.

FIG. 17 illustrates an example of the training information storage table in FIG. 16 according to example embodiments.

DETAILED DESCRIPTION

Figure 1:
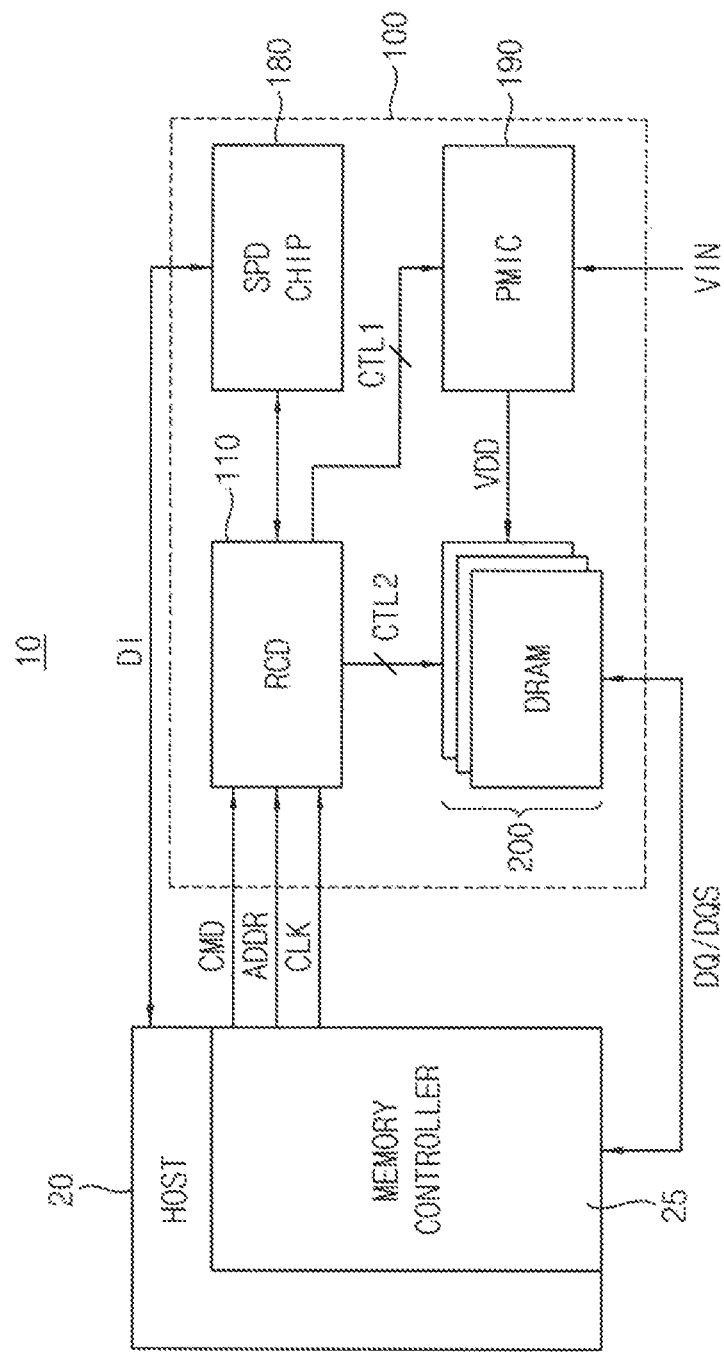
FIG. 1 is a block diagram illustrating a memory system according to example embodiments.

Example embodiments of the inventive concepts will be more clearly understood from the following detailed description taken in conjunction with the accompanying drawings, wherein like reference numerals refer to like parts throughout the various figures unless otherwise specified.

FIG. 1 is a block diagram illustrating a memory system according to example embodiments.

Referring to FIG. 1, a memory system 10 includes a host 20 and a memory module 100. The host 20 may include a memory controller 25.

The memory module 100 may include a control device (or, registered clock driver (RCD), the RCD may be referred to a control device) 110, a serial presence detect (SPD) chip 180 and a power management integrated circuit (PMIC) 190. Further, the memory module 100 may include semiconductor devices 200.

The control device 110 may control the semiconductor memory devices 200 and the PMIC 190 under control of the memory controller 25. For example, the control device 110 may receive an address ADDR, a command CMD, and a clock signal CLK from the memory controller 25. In response to received signals, the control device 110 may control the semiconductor memory devices 200 such that data received through a data signal DQ and a data strobe signal DQS is written in the semiconductor memory devices 200 or such that data stored in the semiconductor memory devices 200 is outputted through the data signal DQ and the data strobe signal DQS. For example, the control device 110 may transmit the address ADDR, the command CMD, and the clock signal CLK from the memory controller 25 to the semiconductor memory devices 200.

The semiconductor memory devices 200 may write data received through the data signal DQ and the data strobe signal DQS under control of the control device 110. Alternatively, the semiconductor memory devices 200 may output the written data through the data signal DQ and the data strobe signal DQS under control of the control device 110. The semiconductor memory devices 200 may include various memory devices.

For example, the semiconductor memory devices 200 may include DRAM-based volatile memory devices. For example, the semiconductor memory devices 200 may include a volatile memory device such as a DRAM, an SRAM, and/or an SDRAM. The semiconductor memory devices 200 may include a double data rate 5 (DDR5) SDRAM.

The SPD chip 180 may be a programmable read only memory (e.g., EEPROM). The SPD chip 180 may include initial information or device information DI of the memory module 100. In example embodiments, the SPD chip 180 may include the initial information or the device information DI such as a module form, a module configuration, a storage capacity, a module type, an execution environment, and the like of the memory module 100. When the memory system 10 including the memory module 100 is booted up, the host 20 may read the device information DI from the SPD chip 180 and may recognize the memory module 100 based on the device information DI. The host 20 may control the memory module 100 based on the device information DI from the SPD chip 180. For example, the host 20 may recognize a type of the semiconductor memory devices 200 included in the memory module 100 based on the device information DI from the SPD chip 180.

In example embodiments, the SPD chip 180 may communicate with the host 20 through a serial bus. The SPD chip 180 may communicate with the control device 110 through a serial bus. The serial bus may include at least one of 2~line serial buses such as an inter-integrated circuit (I2C), a system management bus (SMBus), a power management bus (PMBus), an intelligent platform management interface (IPMI), a management component transport protocol (MCTP), and the like.

The control device 110 may control the PMIC 190 through a first control signal CTL1, and may control the semiconductor memory devices 200 through a second control signal CTL2. The second control signal CTL2 may include the address ADDR, the command CMD, and the clock signal CLK.

The PMIC 190 receives an input voltage VIN, generates a power supply voltage VDD based on the input voltage and provides the power supply voltage VDD to the semiconductor memory devices 200. The semiconductor memory devices 200 operate based on the power supply voltage VDD.

Figure 2:
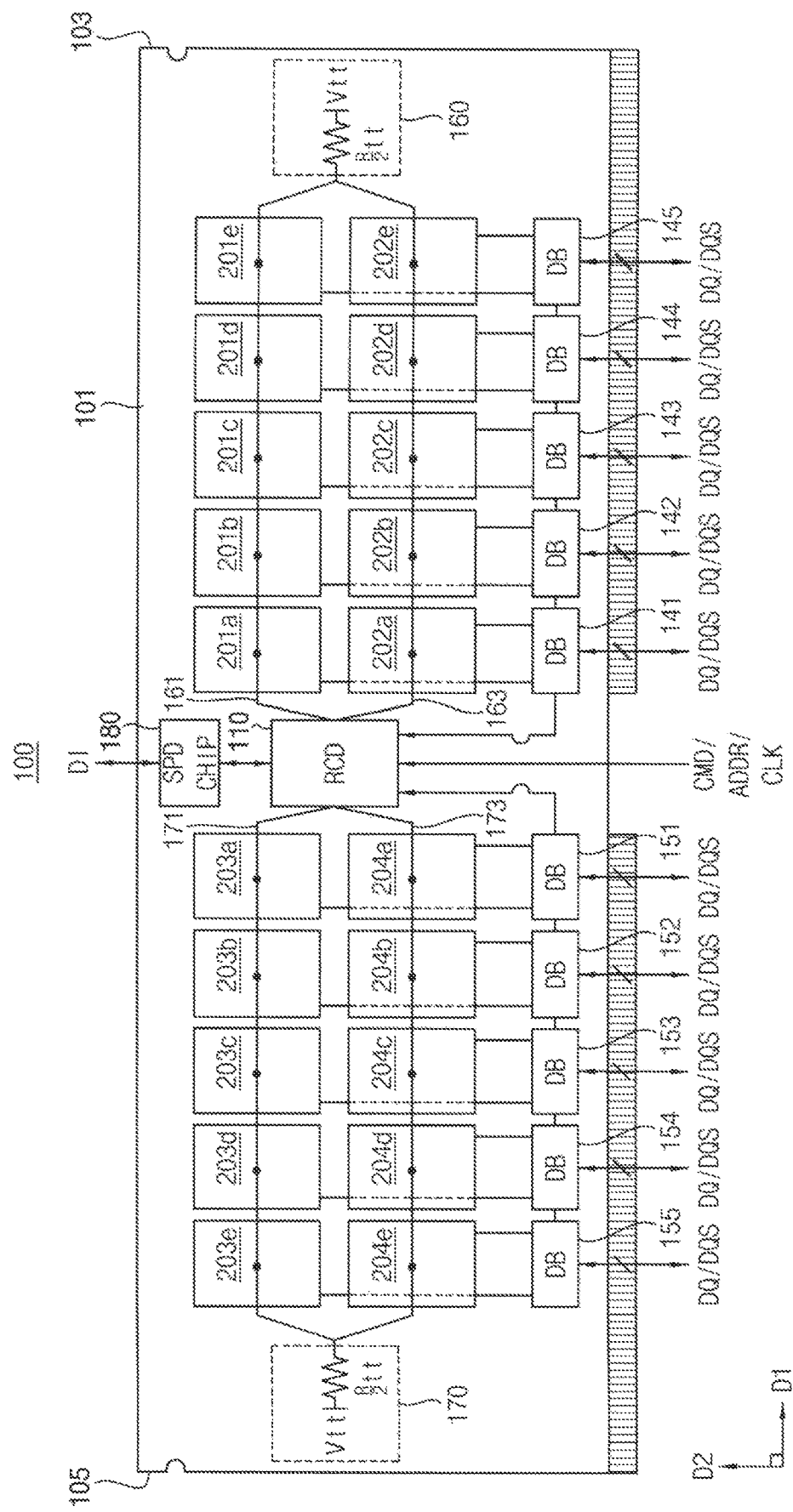
FIG. 2 is a block diagram illustrating an example of the memory module in FIG. 1 in detail according to example embodiments.

FIG. 2 is a block diagram illustrating an example of the memory module in FIG. 1 in detail according to example embodiments.

In FIG. 2 the PMIC 190 is not illustrated for convenience of explanation.

Referring to FIG. 2, the memory module 100 includes the control device 110 disposed (or mounted) in a circuit board (or a module board) 101, a plurality of semiconductor memory devices 201a~201e, 202a~202e, 203a~203e, and 204a~204e, a plurality of data buffers 141~145 and 151~155, a module resistance units 160 and 170 and the SPD chip 180.

Here, the circuit board 101 which is a printed circuit board may extend to a second direction D2, perpendicular to a first direction D1, between a first edge portion 103 and a second edge portion 105 of the first direction D1. The control device 110 may be disposed on a center of the circuit board 101. The plurality of semiconductor memory devices 201a~201e, 202a~202e, 203a~203e, and 204a~204e may be arranged in a plurality of rows between the control device 110 and the first edge portion 103 and between the control device 110 and the second edge portion 105. In this case, the semiconductor memory devices 201a~201e and 202a~202e may be arranged along a plurality of rows between the control device 110 and the first edge portion 103. The semiconductor memory devices 203a~203e, and 204a~204e may be arranged along a plurality of rows between the control device 110 and the second edge portion 105.

A portion of the semiconductor memory devices 201a~201e and 202a~202e may be an error correction code (ECC) memory device. The ECC memory device may perform ECC encoding operation to generate parity bits about data to be written at the memory cells and an ECC decoding operation to correct an error occurring in the data read from the memory cells.

Each of the plurality of semiconductor memory devices 201a~201e, 202a~202e, 203a~203e, and 204a~204e may be coupled to correspond one of the data buffers 141~145 and 151~155 through data transmission line for receiving/transmitting the data signal DQ and the data strobe signal DQS.

The control device 110 may provide a command/address signal to the semiconductor memory devices 201a~201e through a command/address transmission line 161 and may provide a command/address signal to the semiconductor memory devices 202a~202e through a command/address transmission line 163. In addition, the control device 110 may provide a command/address signal to the semiconductor memory devices 203a~203e through a command/address transmission line 171 and may provide a command/address signal to the semiconductor memory devices 204a~204e through a command/address transmission line 173.

The command/address transmission lines 161 and 163 may be connected in common to the module resistance unit 160 disposed to be adjacent to the first edge portion 103, and the command/address transmission lines 171 and 173 may be connected in common to the module resistance unit 170 disposed to be adjacent to the second edge portion 105. Each of the module resistance units 160 and 170 may include a termination resistor Rtt/2 connected to a termination voltage Vtt. In this case, an arrangement of the module resistance units 160 and 170 may reduce the number of the module resistance units, thereby reducing an area where termination resistors are occupied.

In addition, each of the plurality of semiconductor memory devices 201a~201e, 202a~202e, 203a~203e, and 204a~204e may be a DDR5 SDRAM. The SPD chip 180 is disposed to be adjacent to the control device 110

Figure 3:
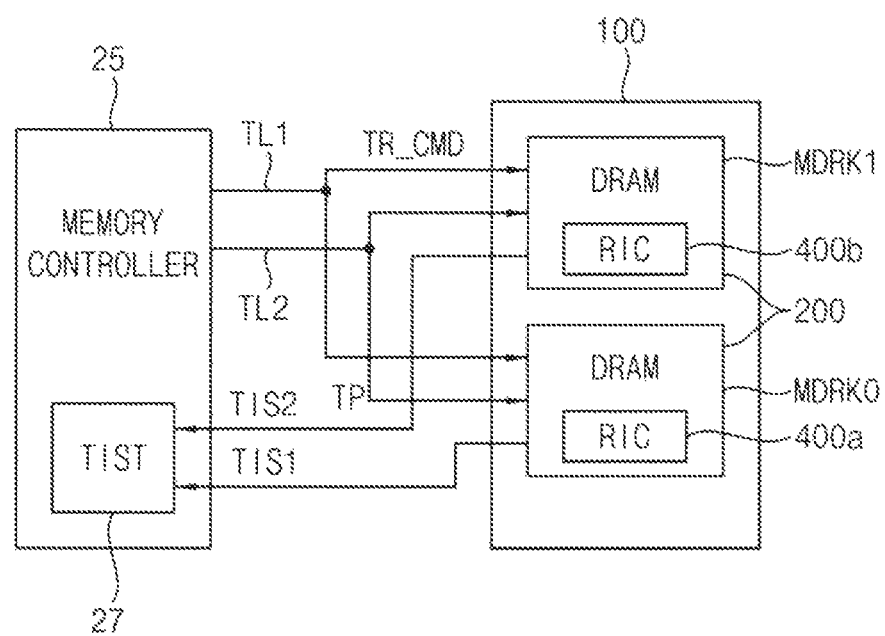
FIG. 3 illustrates a connection relationship between the memory controller and the semiconductor memory devices in the memory system of FIG. 1.

FIG. 3 illustrates a connection relationship between the memory controller and the semiconductor memory devices in the memory system of FIG. 1.

Referring to FIG. 3, the memory module 100 may include at least one first rank of semiconductor memory device MDRK0 and at least one second rank of semiconductor memory device MDRK1. Some portion of the semiconductor memory devices 201a~201e, 202a~202e, 203a~203e, and 204a~204e may correspond to the at least one first rank of semiconductor memory device MDRK0 and other portion of the semiconductor memory devices 201a~201e, 202a~202e, 203a~203e, and 204a~204e may correspond to the at least one second rank of semiconductor memory device MDRK1. The at least one first rank of semiconductor memory device MDRK0 may include a reception interface circuit 400a and the at least one second rank of semiconductor memory device MDRK1 may include a reception interface circuit 400b.

The memory controller 25 may transmit a training command TR_CMD to the semiconductor memory devices MDRK0 and MDRK1 through a first transmission line TL1 and may transmit a training pattern TP to the semiconductor memory devices MDRK0 and MDRK1 through a second transmission line TL2. The reception interface circuits 400a and 400b in the semiconductor memory devices MDRK0 and MDRK1 perform training (operation) simultaneously using the training pattern TP in response to the training command TR_CMD and may transmit, to the memory controller 25, training information signals TIS1 and TIS2, i.e., results of the training.

The memory controller 25 may include a training information storage table 27, and may store, in the training information storage table 27, the training information signals TIS1 and TIS2 per each of the semiconductor memory devices MDRK0 and MDRK1.

In an example embodiment, the memory controller 25 may periodically transmit the training command TR_CMD to the semiconductor memory devices MDRK0 and MDRK1, or may transmit the training command TR_CMD to the semiconductor memory devices MDRK0 and MDRK1 in response to a training request from at least one of the semiconductor memory devices MDRK0 and MDRK1.

Figure 4:
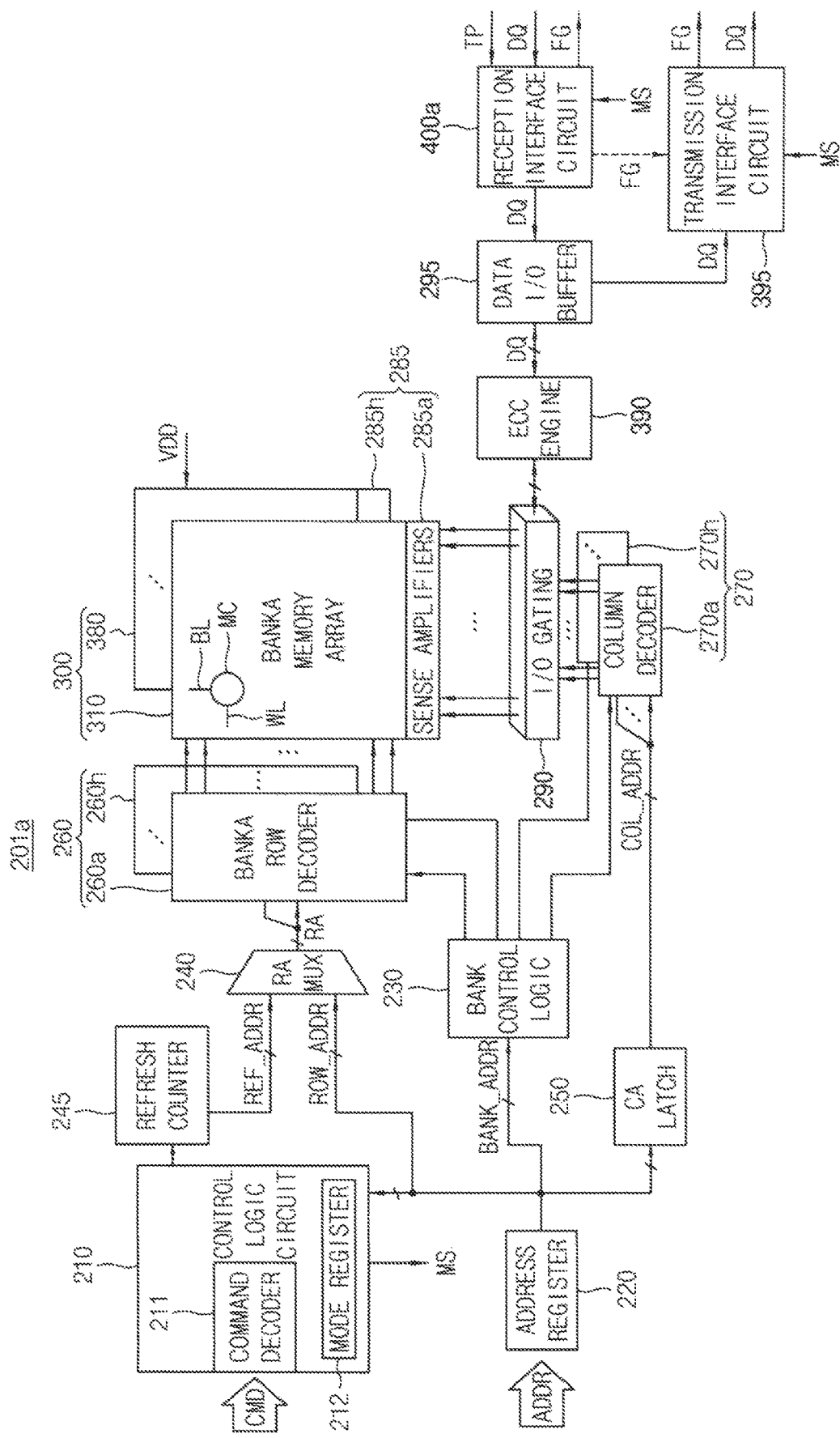
FIG. 4 is a block diagram illustrating one of the semiconductor memory devices in FIG. 2 according to example embodiments.

FIG. 4 is a block diagram illustrating one of the semiconductor memory devices in FIG. 2 according to example embodiments.

Referring to FIG. 4, the semiconductor memory device 201a may include a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245, an error correction code (ECC) engine 390, a reception interface circuit 400a and a transmission interface circuit 395.

The memory cell array 300 may include first through eighth bank arrays 310~380. The row decoder 260 may include first through eighth bank row decoders 260a~260h respectively coupled to the first through eighth bank arrays 310~380, the column decoder 270 may include first through eighth bank column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 may include a plurality of word-lines WL, a plurality of bit-lines BL and a plurality of memory cells MC formed at intersections of the word-lines WL and the bit-lines BL.

Although the semiconductor memory device 201a is illustrated in FIG. 4 as including eight banks, the semiconductor memory device 201a may include any number of banks.

The address register 220 may receive an address ADDR including a bank address BANK_ADDR, a row address ROW_ADDR and a column address COL_ADDR from the control device 110. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may generate a word-line driving voltage based on the power supply voltage VDD and may apply the word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the I/O gating circuit 290 in order to output data corresponding to the column address COL_ADDR.

The I/O gating circuit 290 may include a circuitry for gating input/output data. The I/O gating circuit 290 may further include read data latches for storing data that is output from the first through eighth bank arrays 310~380, and write drivers for writing data to the first through eighth bank arrays 310~380.

Data to be read from one bank array of the first through eighth bank arrays 310~380 may be sensed by a sense amplifier coupled to the one bank array from which the data is to be read, and may be stored in the read data latches. The data stored in the read data latches may be provided to the memory controller 25 via the data I/O buffer 295 and the transmission interface circuit 395 after the ECC engine 390 performs an ECC decoding on the data. Data to be written in one bank array of the first through eighth bank arrays 310~380 may be provided to the data I/O buffer 295 from the memory controller 25. The ECC engine 390 performs an ECC encoding on the data provided to the data I/O buffer 295, and the ECC engine 390 provides the encoded data to the I/O gating circuit 290.

The reception interface circuit 400, in the training mode, may perform a training operation to determine desired (or, alternatively, optimal) equalization coefficients based on a training pattern PT from the memory controller 25, and may transmit a flag signal FG associated with the training to the memory controller 25 directly or via the transmission interface circuit 395.

The control logic circuit 210 may control operations of the semiconductor memory device 201a. For example, the control logic circuit 210 may generate control signals for the semiconductor memory device 201a in order to perform a write operation or a read operation. The control logic circuit 210 may include a command decoder 211 that decodes a command CMD received from the memory controller 25 through the control device 110 and a mode register 212 that sets an operation mode of the semiconductor memory device 201a.

For example, the command decoder 211 may generate the control signals corresponding to the command CMD by decoding a write enable signal, a row address strobe signal, a column address strobe signal, a chip select signal, etc. The control logic circuit 210 may generate a mode signal MS indicating one of the training mode and the normal mode and may provide the mode signal MS to the reception interface circuit 400a and the transmission interface circuit 395.

The reception interface circuit 400, in response to the mode signal MS, may determine the desired (or, alternatively, the optimal) equalization coefficients of an equalizer based on the training pattern TP in the training mode, may receive the data DQ based on the desired (or, alternatively, the optimal) equalization coefficients and may provide the data DQ to the data I/O buffer 295 in the normal mode.

Figure 5:
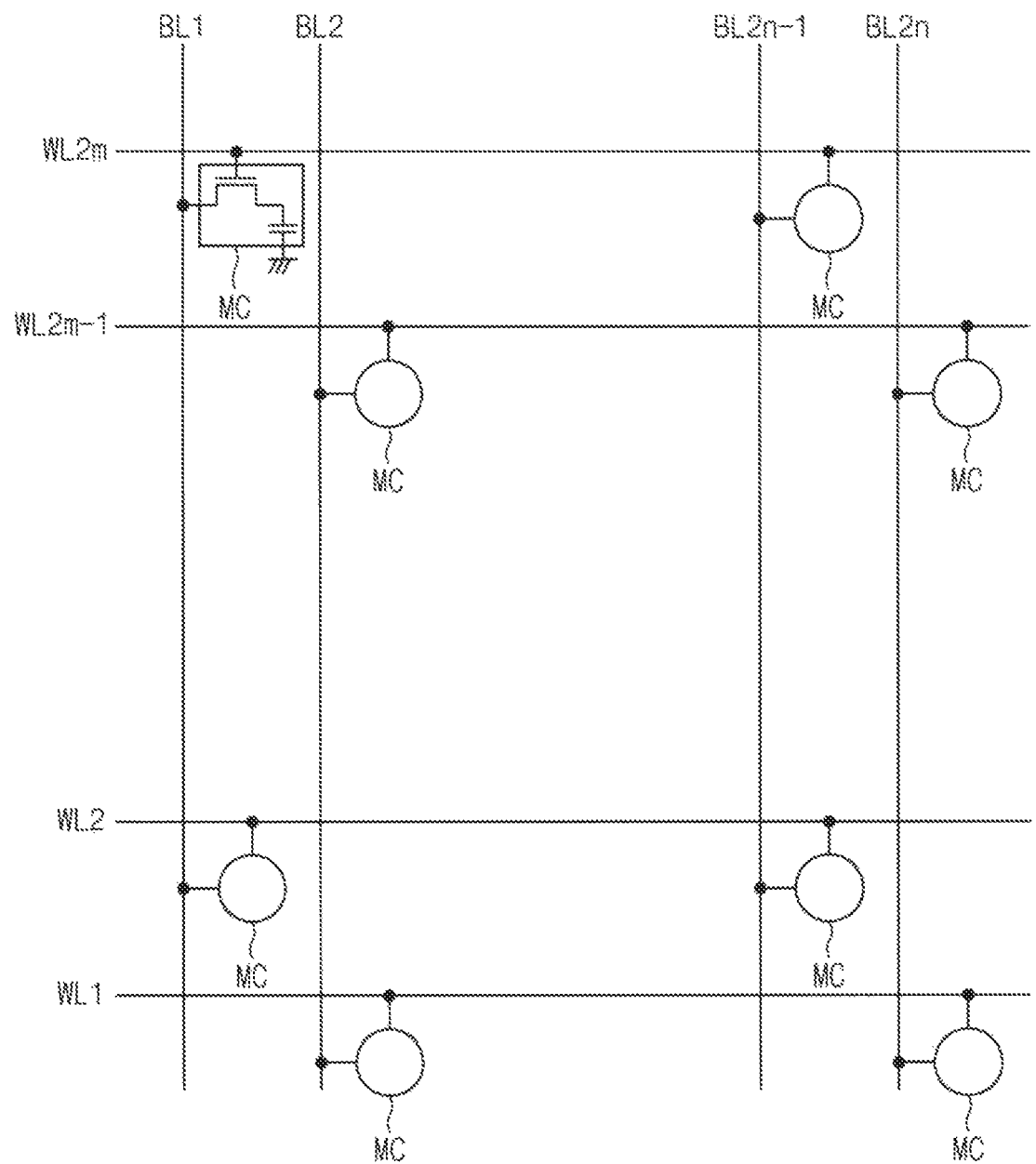
FIG. 5 illustrates an example of the first bank array in the semiconductor memory device of FIG. 4.

FIG. 5 illustrates an example of the first bank array in the semiconductor memory device of FIG. 4.

Referring to FIG. 5, the first bank array 310 includes a plurality of word-lines WL1~WL2m (m is a natural number greater than two), a plurality of bit-lines BL1~BL2n (n is a natural number greater than two), and a plurality of memory cells MCs disposed near intersections between the word-lines WL1~WL2m and the bit-lines BL1~BL2n. In one embodiment, each of the plurality of memory cells MCs may include a dynamic random access memory (DRAM) cell structure. The plurality of word-lines WL1~WL2m to which the plurality of memory cells MCs are connected may be defined as rows of the first bank array 310 and the plurality of bit-lines BL1~BL2n to which the plurality of memory cells MCs are connected may be defined as columns of the first bank array 310.

Figure 6:
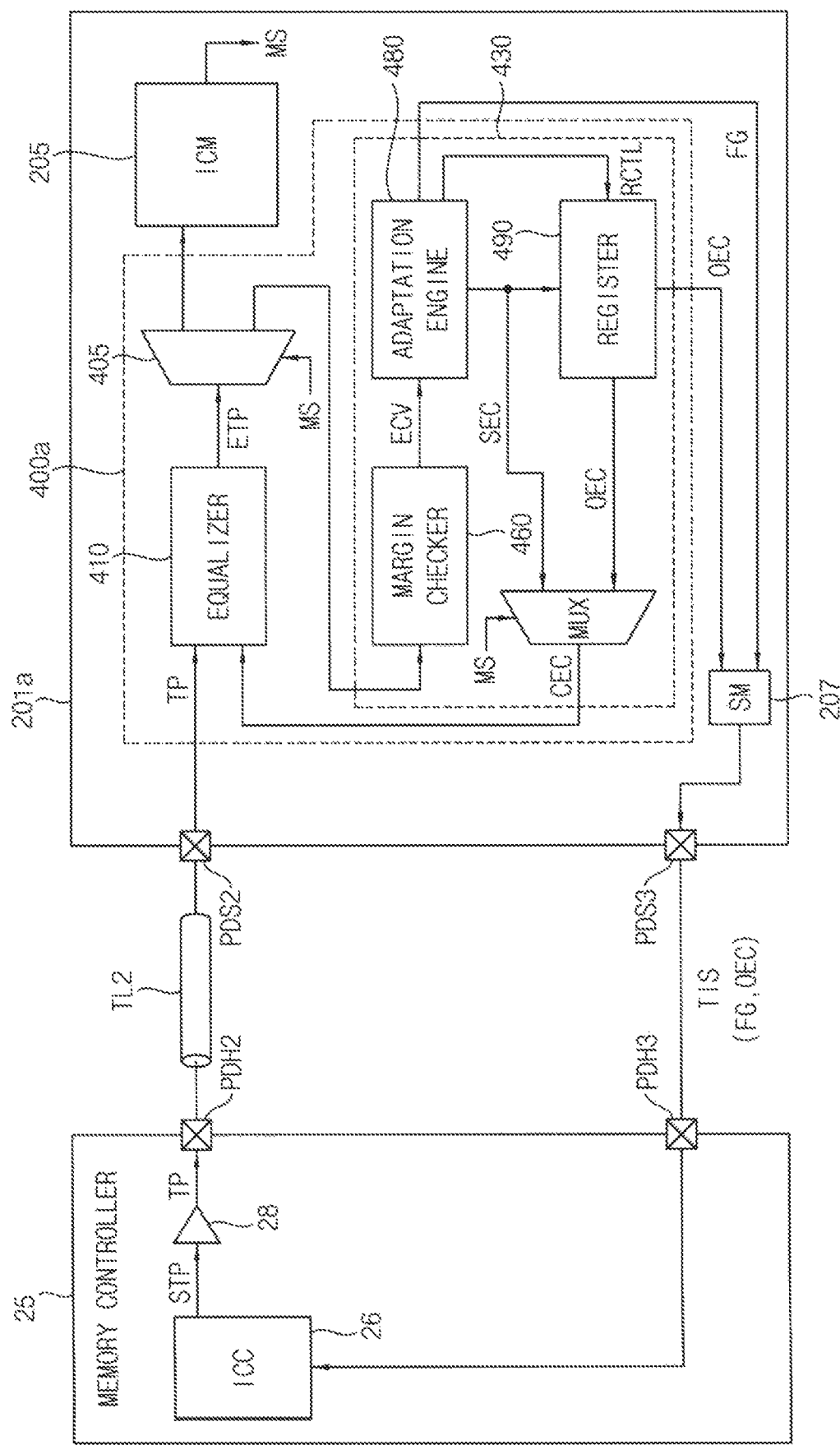
FIG. 6 illustrates an example of connection between the memory controller and one semiconductor memory device in the memory system of FIG. 1 according to example embodiments.

FIG. 6 illustrates an example of connection between the memory controller and one semiconductor memory device in the memory system of FIG. 1 according to example embodiments.

Referring to FIG. 6, a memory system may include the memory controller 25 and the semiconductor memory device 201a.

The memory controller 25 and the semiconductor memory device 201a may be connected to each other through a transmission line TL2. Even though a pair of pads PDH2 and PDS2, the transmission line TL connecting the pads PDH2 and PDS2 and a pair of pads PDH3 and PDS3 are illustrated in FIG. 6 for convenience of illustration, each of the memory controller 25 and the semiconductor memory device 201a may include a plurality of input-output pads and a plurality of transmission lines connecting the input-output pads.

The memory controller 25 may include an internal circuit 26 and a transmission driver 28. The transmission driver 28 in the memory controller 25 may output the training pattern TP to the pad PDH2 based on a stored training pattern STP from the internal circuit 26.

The semiconductor memory device 201a may include an internal circuit 205, the reception interface circuit 400a and a signal merger 207. The internal circuit 205 may correspond to components included in the semiconductor memory device 201a of FIG. 4 except the reception interface circuit 400a and the transmission interface circuit 395.

The reception interface circuit 400a may include an equalizer 410, a demultiplexer 405 and a self-training circuit 430. The self-training circuit 430 may include a margin checker 460, an adaption engine 480, a register 490 and a multiplexer MUX.

The equalizer 410, in the training mode, may equalize the training pattern TP based on control equalization coefficients CEC to output an equalizer output pattern ETP. The demultiplexer 405, in response to the mode signal, may provide the equalizer output pattern ETP to the margin checker 460 in the training mode and may provide the equalizer output pattern ETP to the internal circuit 205 in the normal mode.

The self-training circuit 430 may perform a training (operation) to search for the desired (or, alternatively, the optimal) equalization coefficients of the equalizer 410 in response to the equalizer output pattern ETP and may transmit, to the memory controller 25, a training information signal TIS including the searched desired (or, alternatively, optimal) equalization coefficients OEC.

The margin checker 460 may compare the equalizer output pattern ETP with a reference pattern to output an error counting value ECV that indicates a difference between the equalizer output pattern ETP and the reference pattern. The adaptation engine 480 may adaptively adjust searching equalization coefficients SEC to search the desired (or, alternatively, optimal) equalization coefficients OEC based on the error counting value ECV and may provide the equalizer 410 with the searching equalization coefficients SEC as control equalization coefficients CEC.

When the training is finished, the adaptation engine 480 may provide the signal merger 207 with a flag signal FG including a pass/fail bit and a memory identifier bit. The pass/fail bit may indicate a pass or a fail of the training and the memory identifier bit may identify the semiconductor memory device 201a.

The register 490 may store the searching equalization coefficients SEC as the desired (or, alternatively, the optimal) equalization coefficients OEC when the difference between the equalizer output pattern ETP and the reference pattern becomes a desired (or, alternatively, a minimum) value, may provide the memory controller 25 with the desired (or, alternatively, the optimal) equalization coefficients as a portion of the training information signal TIS in the training mode, and may provide the equalizer 410 as the desired (or, alternatively, the optimal) equalization coefficients OEC as the control equalization coefficients CEC in the normal mode. The register 490 may provide the desired (or, alternatively, optimal) equalization coefficients OEC to the signal merger 207 in response to a control signal RCTL from the adaptation engine 480.

The signal merger 207 may receive the flag signal FG and the desired (or, alternatively, optimal) equalization coefficients OEC, may merge the flag signal FG and the desired (or, alternatively, optimal) equalization coefficients OEC into the training information signal TIS and may transmit the training information signal TIS to the internal circuit 26 of the memory controller 25 through the pads PDS3 and PDH3.

Although not illustrated, the memory controller 25 in FIG. 6 may include a reception interface circuit such as the reception interface circuit 400a. The reception interface circuit may receive a training pattern from the semiconductor memory device 201a, may perform a training to search desired (or, alternatively, optimal) equalization coefficients of an equalizer in the reception interface circuit and may store the searched desired (or, alternatively, optimal) equalization coefficients in a register in the memory controller 25, in the training mode. The reception interface circuit may receive data signal DQ from the semiconductor memory device 201a based on the desired (or, alternatively, optimal) equalization coefficients and may provide the data signal DS to the internal circuit 26, in the normal mode.

Figure 7:
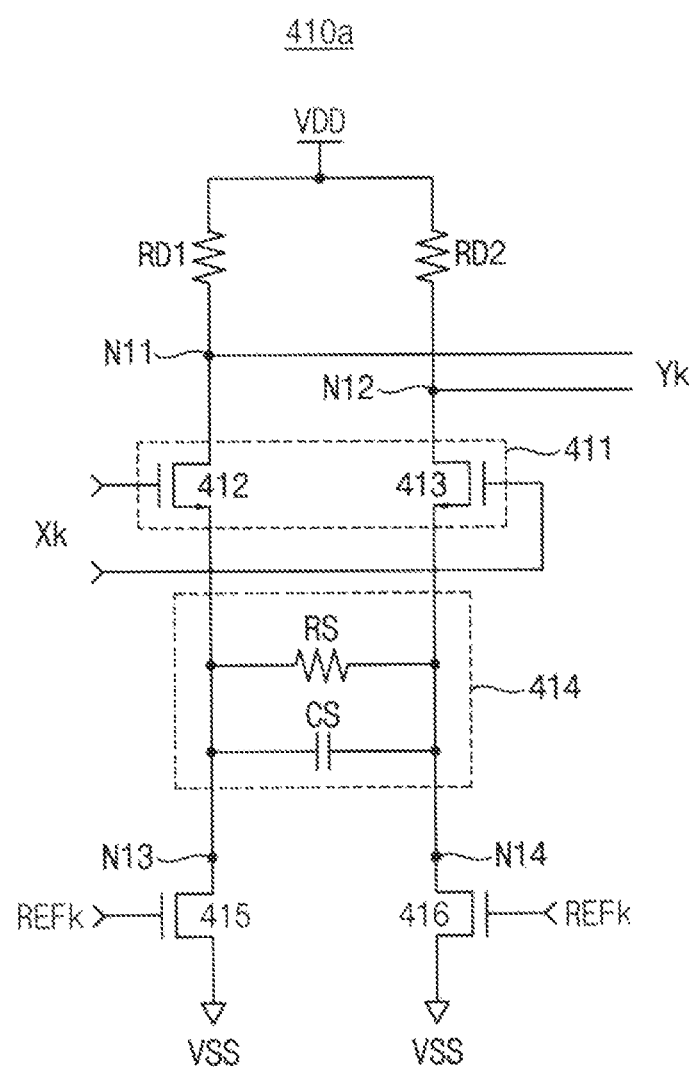
FIG. 7 is a circuit diagram illustrating an example of the equalizer in the reception interface circuit in FIG. 6 according to example embodiments.

FIG. 7 is a circuit diagram illustrating an example of the equalizer in the reception interface circuit in FIG. 6 according to example embodiments.

Referring to FIG. 7, an equalizer 410a may be implemented with a continuous time linear equalizer (CTLE) and the equalizer 410a may include resistors RD1 and RD2 connected to a power supply voltage VDD, an input unit 411, a filter 414 and bias transistors 415 and 416.

The input unit 411 may include n-channel metal-oxide semiconductor (NMOS) transistors 412 and 413. The NMOS transistor 412 is coupled to the resistor RD1 at a node N11 and the NMOS transistor 413 is coupled to the resistor RD2 at a node N12. The filter 414 may include a resistor RS and a capacitor CS coupled in parallel between sources of the NMOS transistors 412 and 413.

The bias transistor 415 includes a drain coupled to the capacitor CS at a node N13, a gate receiving a reference bit REFk and a source coupled to a ground voltage VSS. The bias transistor 416 includes a drain coupled to the capacitor CS at a node N14, a gate receiving the reference bit REFk and a source coupled to the ground voltage VSS. The reference bit REFk may correspond to the control equalization coefficients CEC.

Input bit Xk is applied to gates of the NMOS transistors 412 and 413 in the input unit 411 and an output bit Yk is provided at the nodes N11 and N12. The Input bit Xk may be one of consecutive sequence of the training pattern TP.

Figure 8:
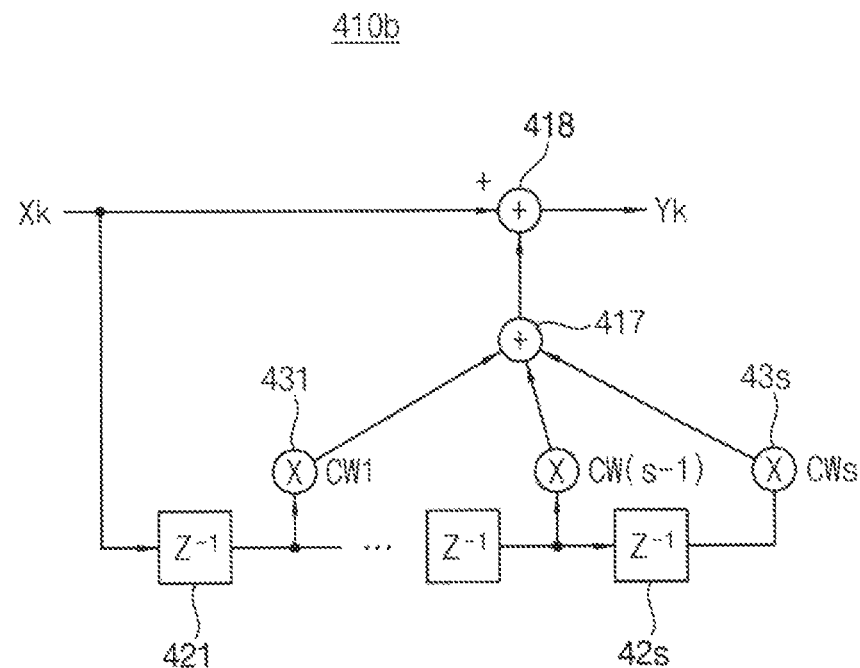
FIG. 8 is a circuit diagram illustrating another example of the equalizer in the reception interface circuit in FIG. 6 according to example embodiments.

FIG. 8 is a circuit diagram illustrating another example of the equalizer in the reception interface circuit in FIG. 6 according to example embodiments.

Referring to FIG. 8, an equalizer 410b may be implemented with a feed-forward equalizer (FFE) and the equalizer 410b may include delay elements 421~42s, multipliers 431~43s, an adder 417 and a subtractor 418. Here, s is an integer greater than one.

The delay elements 421~42s may sequentially delay the input bit Xk, the multipliers 431~43s multiply outputs of the delay elements 421~42s by control equalization coefficients CW1~CWs respectively, the adder 417 adds outputs of the multipliers 431~43s and the subtractor 418 subtracts an output of the adder 417 from the input bit Xk to provide the output bit Yk. The output bit Yk may be one of consecutive sequence of the equalizer output pattern ETP.

Figure 9:
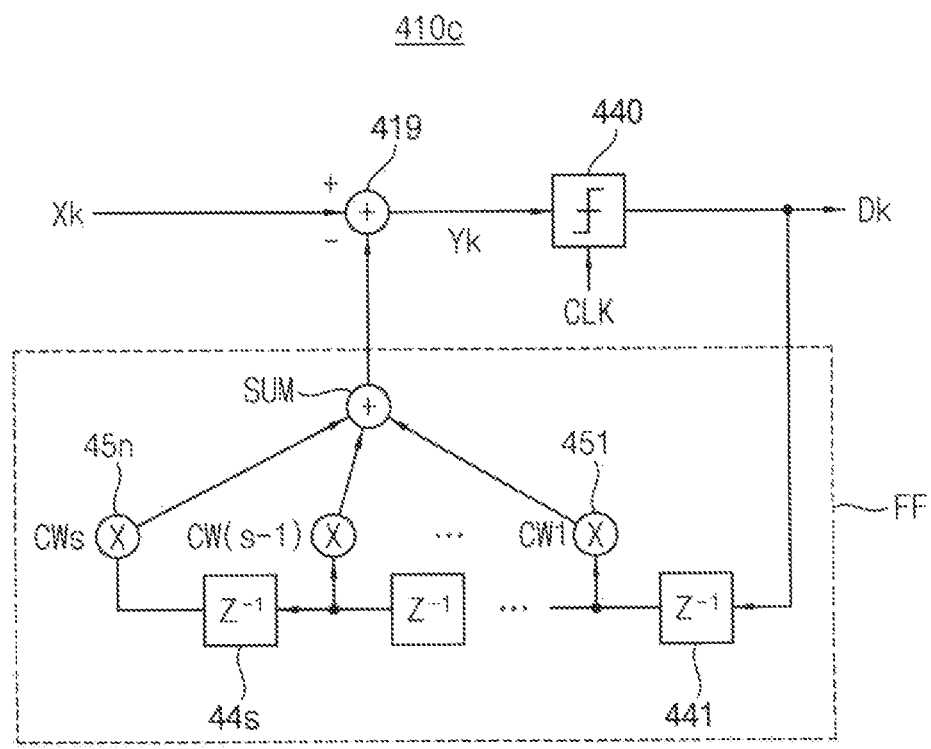
FIG. 9 is a circuit diagram illustrating another example of the equalizer in the reception interface circuit in FIG. 6 according to example embodiments.

FIG. 9 is a circuit diagram illustrating another example of the equalizer in the reception interface circuit in FIG. 6 according to example embodiments.

Referring to FIG. 9, an equalizer 410c may be implemented with a decision feedback equalizer (DEF) and the equalizer 410c may include delay elements 441~44s, multipliers 451~45s, an adder SUM, a subtractor 419 and a decision logic. The delay elements 441~44s, the multipliers 451~45s, and the adder SUM may constitute a feedback filter FF.

The delay elements 441~44s may sequentially delay a decision bit Dk, the multipliers 451~45s multiply outputs of the delay elements 431~43s by the control equalization coefficients CW1~CWs respectively, the adder SUM adds outputs of the multipliers 41~45s and the subtractor 419 subtracts an output of the adder SUM from the input bit Xk to provide the output bit Yk. The decision logic 440 may determines a logic level of the output bit Yk based on the clock signal CLK to provide the decision bit Dk The decision bit Dk may be one of consecutive sequence of the equalizer output pattern ETP.

The DEF 410c may errors between symbols generated by signal distortion by feeding-back weighted values by the control equalization coefficients CW1~CWs to the decision bit DK through the feedback filter FF.

The equalizer 410 in the reception interface circuit 400a in FIG. 6 may be implemented by the FFE 410b of FIG. 8 and the DEF 410c of FIG. 9. In this case, the FFE 410b receives the input bit Xk to provide the output bit Yk and the DEF 410c receives the output bit Yk of the FFE 410b as an input bit to output the decision bit Dk.

Figure 10:
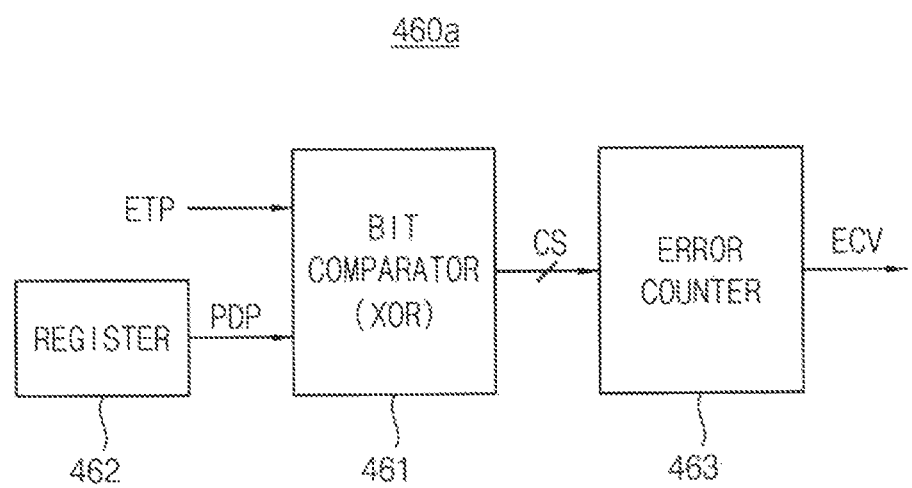
FIG. 10 is a block diagram illustrating an example of the margin checker in the self-training circuit in FIG. 6 according to example embodiments.

FIG. 10 is a block diagram illustrating an example of the margin checker in the self-training circuit in FIG. 6 according to example embodiments.

Referring to FIG. 10, a margin checker 460a may include a register 462, a bit comparator 461 and an error counter 463.

The register 462 stores expected values of the training pattern TP as a reference pattern PDP. The bit comparator 461 compares corresponding bits of the equalizer output pattern ETP and the reference pattern PDP to output a comparison signal CS. The bit comparator 461 may include a plurality of exclusive OR gates. The error counter 463 may output the error counting value ECV based on the comparison signal CS. Therefore, the error counting value ECV may indicate a number of different bits between the training pattern TP and the reference pattern PDP.

Figure 11:
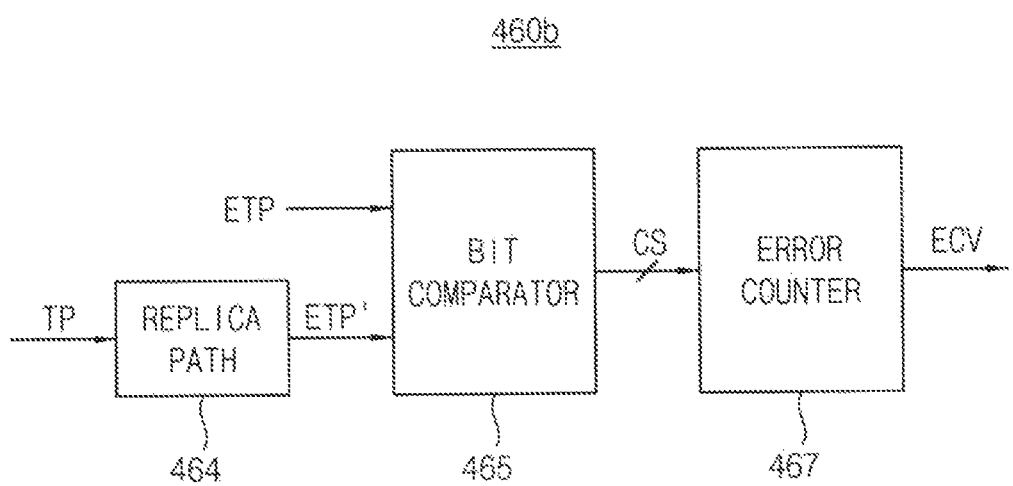
FIG. 11 is a block diagram illustrating another example of the margin checker in the self-training circuit in FIG. 6 according to example embodiments.

FIG. 11 is a block diagram illustrating another example of the margin checker in the self-training circuit in FIG. 6 according to example embodiments.

Referring to FIG. 11, a margin checker 460b may include a replica path 464, a bit comparator 465 and an error counter 467.

The replica path 464 is formed by replicating a path that provides the equalizer output pattern ETP in response to the training pattern TP and is independent from an external influence. The replica path 464 outputs a reference pattern ETP' in response to the training pattern TP. The reference pattern ETP' may correspond to an expected pattern that the equalizer output pattern ETP do not experience noises or interferences. The bit comparator 465 compares corresponding bits of the equalizer output pattern ETP and the reference pattern ETP' to output a comparison signal CS. The bit comparator 465 may include a plurality of exclusive OR gates. The error counter 467 may output the error counting value ECV based on the comparison signal CS. Therefore, the error counting value ECV may indicate a number of different bits between the training pattern TP and the reference pattern ETP'.

Figure 12:
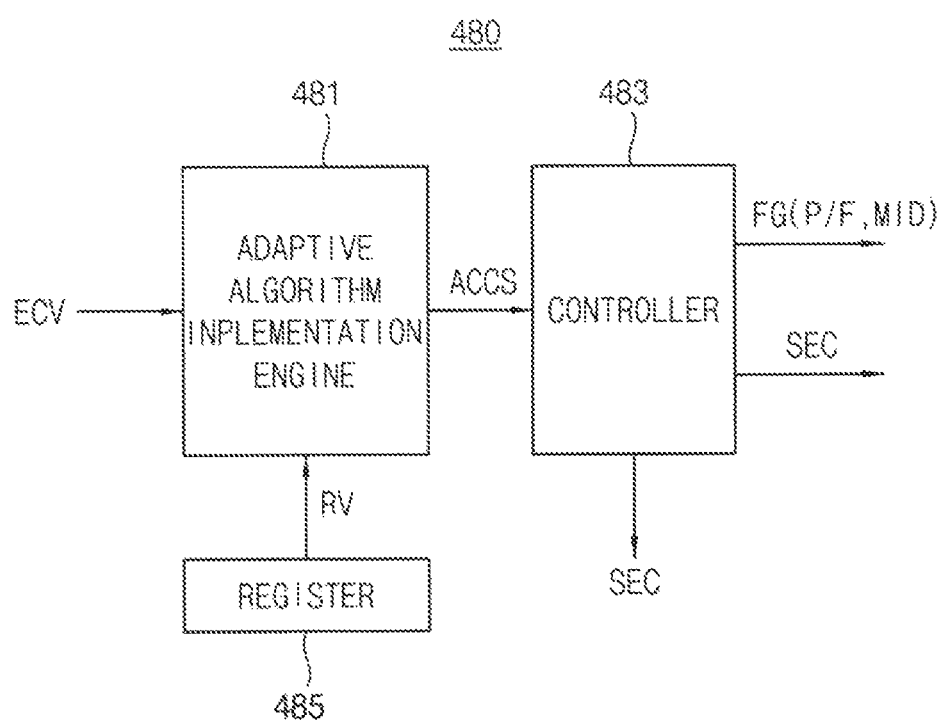
FIG. 12 is a block diagram illustrating an example of the adaptation engine in the self-training circuit in FIG. 6 according to example embodiments.

FIG. 12 is a block diagram illustrating an example of the adaptation engine in the self-training circuit in FIG. 6 according to example embodiments.

Referring to FIG. 12, the adaptation engine 480 may include an adaptive algorithm implementation engine 481, a controller 483 and a register 485.

The register 485 stores a reference value RV. The adaptive algorithm implementation engine 481 receives the error counting value ECV and the reference value RV and outputs an adaptive coefficient control signal ACCS to reduce (or, alternatively, minimize) a difference between the error counting value ECV and the reference value RV based on the error counting value ECV and the reference value RV.

The controller 483 provides the equalizer 410 with the searching equalization coefficients SEC as the control equalization coefficient CEC in response to the adaptive coefficient control signal ACCS and the controller 483 outputs the searching equalization coefficients SEC as the desired (or, alternatively the optimal) equalization coefficients OEC when the difference between the error counting value ECV and the reference value RV becomes the desired (or, alternatively, the minimum) value. In addition, when the adaptive coefficient control signal ACCS indicates that the difference between the error counting value ECV and the reference value RV becomes the desired (or, alternatively, the minimum) value, the controller 783 outputs the flag signal FG including the pass/fail bit that indicates a pass of the training and the memory identifier bit MID that identifies a corresponding semiconductor memory device, i.e., the semiconductor memory device 201a.

The adaptive algorithm implementation engine 481 may output the adaptive coefficient control signal ACCS to render the difference between the error counting value ECV and the reference value RV the desired (or, alternatively, the minimum) value by using, for example, one of a zero forcing (ZF) algorithm, a least mean square (LMS) algorithm and a recursive least square (RLS) algorithm.

The ZF algorithm converges the error counting value ECV to zero, the LMS algorithm generates the least mean square of the difference between the error counting value ECV and the reference value RV and the RLS algorithm generates the least square mean of the difference between the error counting value ECV and the reference value RV using feedback.

Figure 13:
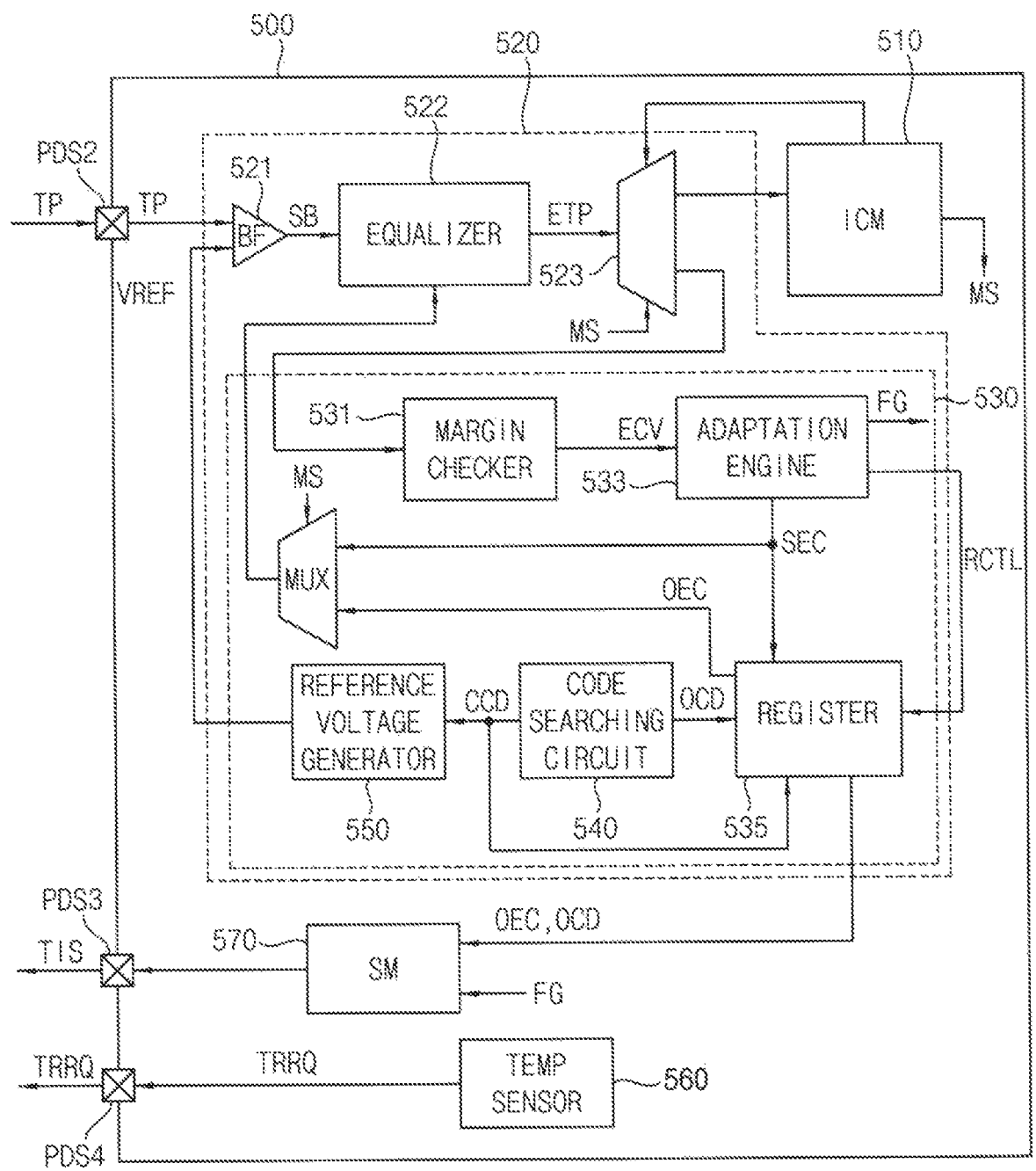
FIG. 13 is a block diagram illustrating a semiconductor memory device according to example embodiments.

FIG. 13 is a block diagram illustrating a semiconductor memory device according to example embodiments.

Each of the semiconductor memory devices 201a~201e, 202a~202e, 203a~203e, and 204a~204e in the memory module 100 in FIG. 2 may employ a semiconductor memory device 500 of FIG. 13.

Referring to FIG. 13, the semiconductor memory device 500 may include an internal circuit 510, a reception interface circuit 520, a temperature sensor 560 and a signal merger 570.

The reception interface circuit 520 may include a (reception) buffer 521, an equalizer 522, a demultiplexer 523 and a self-training circuit 530. The self-training circuit 530 may include a margin checker 531, an adaption engine 533, a register 535, a multiplexer MUX, a code searching circuit 540 and a reference voltage generator 550.

Since configuration and operation of each of the equalizer 522 and the demultiplexer 523 are substantially similar with configuration and operation each of the equalizer 410 and the demultiplexer 405, and configuration and operation of each of the margin checker 531, the adaption engine 533, and the register 535 are substantially similar with configuration and operation each of the margin checker 460, the adaption engine 480, and the register 490 in FIG. 6, detailed description on the equalizer 522, the demultiplexer 523, the margin checker 531, the adaption engine 533, and the register 535 will be omitted.

In the training mode, the buffer 521 compares the training pattern TP with a reference voltage VREF to generate a buffer signal SB. The equalizer 522 equalizes the buffer signal SB based on the control equalization coefficients CEC to provide the equalizer output pattern ETP.

The reference voltage generator 550 may generate the reference voltage VREF in response to a control code CCD. The code searching circuit 540, in the training mode, may outputs a scan code that sequentially changes as the control code for searching a desired (or, alternatively, optimal) code corresponding to a desired (or, alternatively, optimal) voltage level of the reference voltage VREF and may store the searched code CCD in the register 535.

When the code searching circuit 540 searches the desired (or, alternatively, optimal) control code corresponding to the desired (or, alternatively, optimal) voltage level of the reference voltage VREF, the training for searching desired (or, alternatively, optimal) values of the control equalization coefficients CEC as described above.

The register 535 may store the control code CCD corresponding to the desired (or, alternatively, optimal) voltage level as the desired (or, alternatively, optimal) control code OCD and may store the searching equalization coefficients SEC as the desired (or, alternatively, optimal) equalization coefficients OEC when the difference between the equalizer output pattern ETP and the reference pattern becomes a desired (or, alternatively, a minimum) value. The register 535 may provide the signal merger 570 with the desired (or, alternatively, optimal) control code OCD and the desired (or, alternatively, optimal) equalization coefficients OEC, and the signal merger 570 may merge the desired (or, alternatively, optimal) control code OCD, the desired (or, alternatively, optimal) equalization coefficients OEC and the flag signal FG to generate the training information signal TIS. The signal merger 570 may transmit the training information signal TIS to the memory controller 25 through the pad PDS3.

The temperature sensor 560 may sense operating temperature of the semiconductor memory device 500, may compare the operating temperature with at least one reference temperature, and may transmit, a training request signal TRRQ to the memory controller 25 through a pad PDS4 when the operating temperature is higher than the reference temperature. The training request signal TRRQ may be a signal that requests training of the semiconductor memory device 500.

The memory controller 25 may apply a training command TR_CMD to the semiconductor memory device 500 in response to the training request signal TRRQ after the semiconductor memory device 500 completes current memory operation. The semiconductor memory device 500 may set the desired (or, alternatively, optimal) control code OCD and the desired (or, alternatively, optimal) equalization coefficients OEC again at increased temperature in response to the training command TR_CMD.

Figure 14:
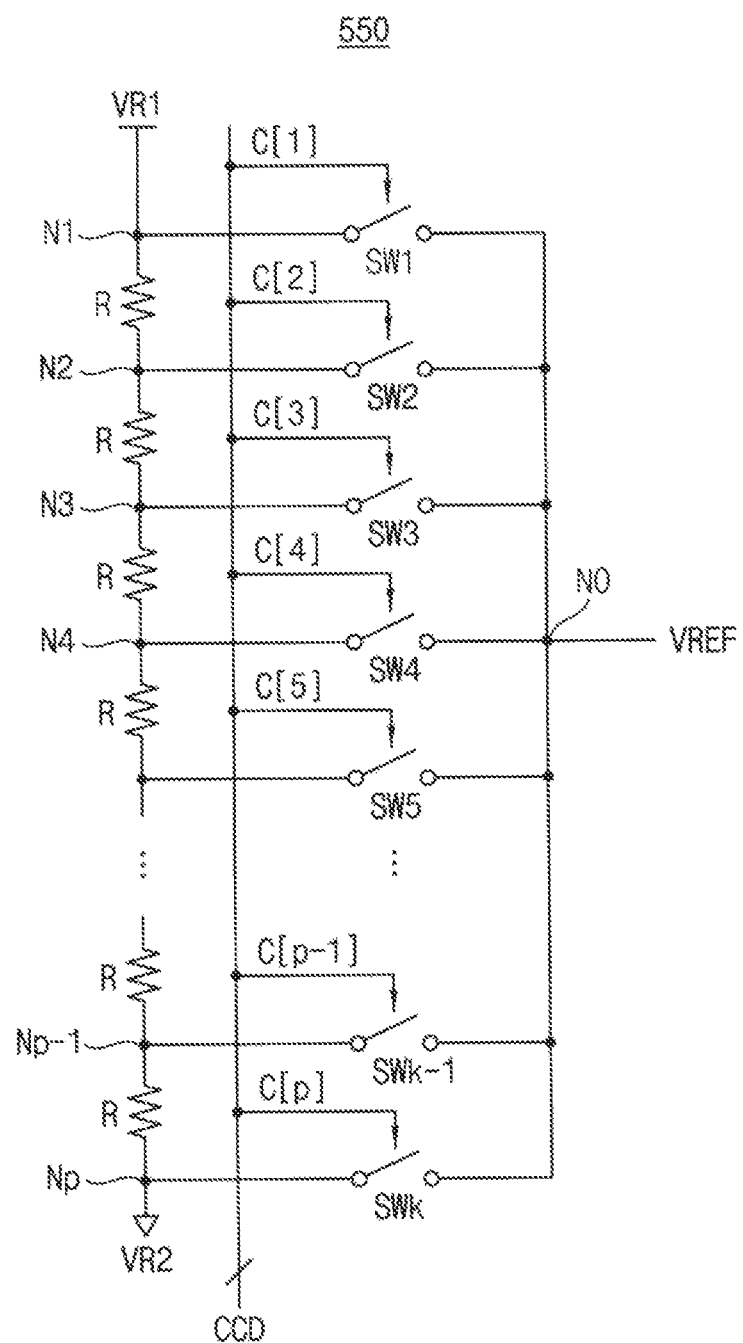
FIG. 14 is a circuit diagram illustrating the reference voltage generator in the self-training circuit in FIG. 13 according to example embodiments.

FIG. 14 is a circuit diagram illustrating the reference voltage generator in the self-training circuit in FIG. 13 according to example embodiments.

FIG. 14 illustrates the reference voltage generator 550 of a resistance division scheme.

Referring to FIG. 14, the reference voltage generator 550 may include a plurality of division resistors R and a plurality of switches SW1~SWp. The division resistors R may be connected in series between a first division node N1 and a p-th division node Np. A first voltage VR1 may be applied to the first division node N1 and a second voltage VR2 lower than the first voltage VR1 may be applied to the p-th node Np. For example, the first voltage VR1 may be a power supply voltage and the second voltage VR2 may be a ground voltage. The switches SW1~SWp may be connected in parallel between the division nodes N1~Np and an output node NO. The switches SW1~SWp may control electrical connections between the division nodes N1~Np and the output node NO in response to code bits C[1]~C[p] of the control code CCD, respectively.

For example, only one of the code bits C[1]~C[p] may be activated at one time as a thermometer code and the switch corresponding to the activated code bit may be turned on to provide the voltage of the corresponding division node to the output node NO as the reference voltage VREF. For example, the above-mentioned sequential change of the scan code may be performed by selectively activating the code bits C[1]~C[p].

The code bits C[1]~C[p] may be activated sequentially one by one in the direction from the p-th code bit [Cp] to the first code bit C[1] so that the reference voltage VREF increasing stepwise may be provided. In contrast, the code bits C[1]~C[p] may be activated sequentially one by one in the direction from the first code bit [C1] to the p-th code bit C[p] so that the reference voltage VREF decreasing stepwise may be provided.

Figure 15:
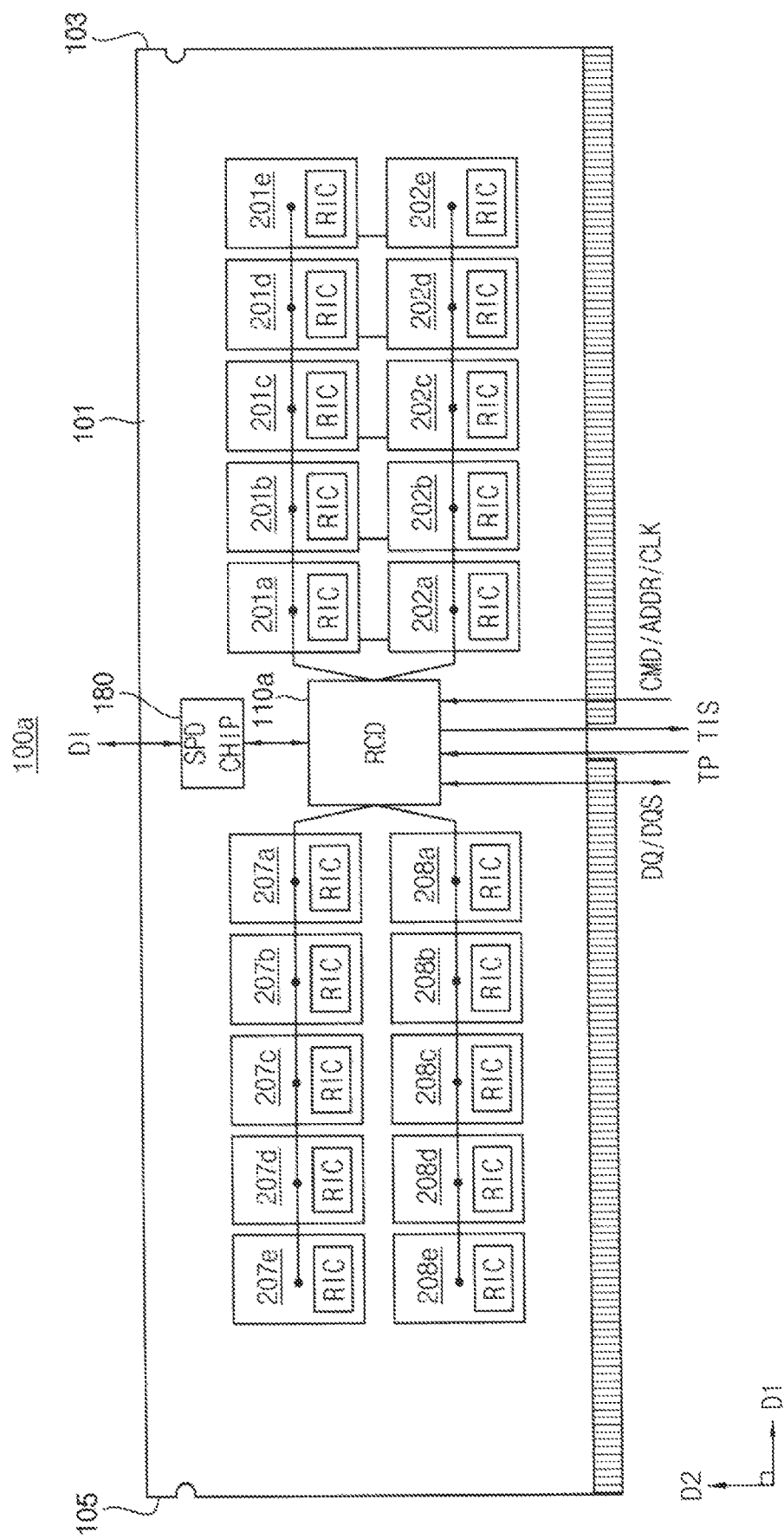
FIG. 15 is a block diagram illustrating another example of the memory module in FIG. 1 in detail according to example embodiments.

FIG. 15 is a block diagram illustrating another example of the memory module in FIG. 1 in detail according to example embodiments.

A memory module 100a of FIG. 15 differs from the memory module 100 of FIG. 2 in that the memory module 100a does not include data buffers which receive/transmit the data signal DQ and the data strobe signal DQS from/to the plurality of semiconductor memory devices 201a~201e, 202a~202e, 203a~203e, and 204a~204e. The memory module 100a may receive/transmit the data signal DQ and the data strobe signal DQS from/to the memory controller 25 through a control device 110a. In addition, the control device 110a may transfer the training pattern TP to the semiconductor memory devices 201a~201e, 202a~202e, 203a~203e, and 204a~204e, may receive the training information signal TIS from each of the semiconductor memory devices 201a~201e, 202a~202e, 203a~203e, and 204a~204e and transmit the training information signal TIS to the memory controller 25, in the training mode.

In an example embodiment, each of the semiconductor memory devices 201a~201e, 202a~202e, 203a~203e, and 204a~204e may receive the training pattern TP from the memory controller 25 through the control device 110a in the training mode and may receive/transmit the data signal DQ and the data strobe signal DQS with the memory controller 25 through the control device 110a. In this case, the control device 110a may receive the training information signal TIS from each of the semiconductor memory devices 201a~201e, 202a~202e, 203a~203e, and 204a~204e and may transmit the training information signal TIS to the memory controller 25.

Figure 16:
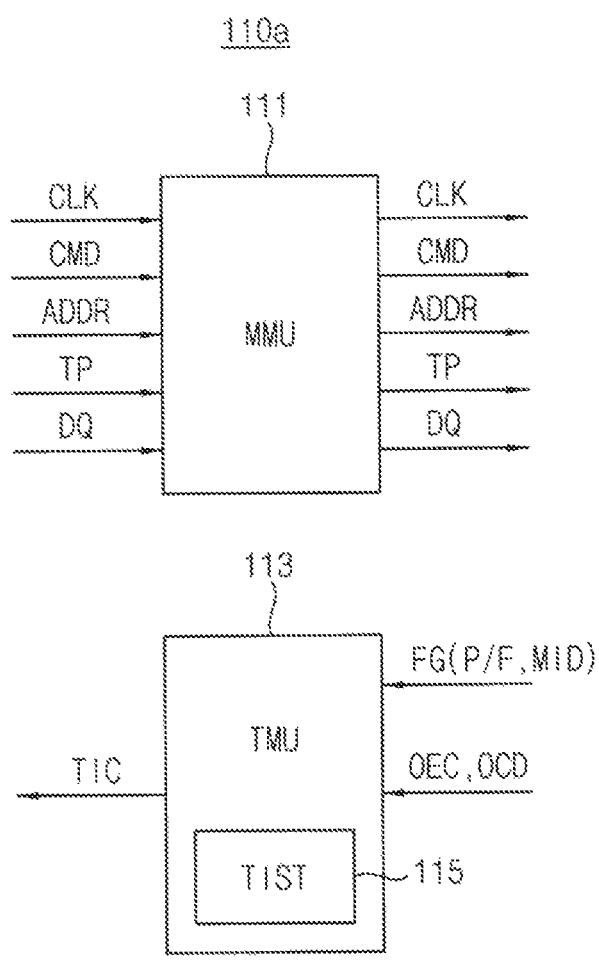
FIG. 16 is a block diagram illustrating an example of the control device in the memory module of FIG. 15 according to example embodiments.

FIG. 16 is a block diagram illustrating an example of the control device in the memory module of FIG. 15 according to example embodiments.

Referring to FIG. 16, the control device 110a may include a memory management unit 111 and a training management unit 113.

The memory management unit 111 may receive the clock signal CLK, the command CMD, the address ADDR and the data signal DQ and may repeat the clock signal CLK, the command CMD, the address ADDR and the data signal DQ to the semiconductor memory devices 200. In addition, the memory management unit 111 may receive the training pattern TP and may repeat the training pattern TP to the semiconductor memory devices 200 in the training mode.

The training management unit 113 may receive the training information signal TIS from each of the semiconductor memory devices 200 and may transfer the training information signal TIS to the memory controller 25. The training management unit 113 may include a training information storage table 115.

Figure 17:
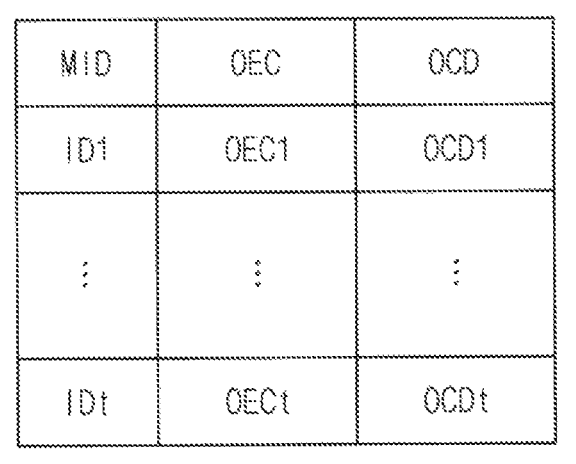

FIG. 17 illustrates an example of the training information storage table in FIG. 16 according to example embodiments.

Referring to FIG. 17, the training information storage table 115 may store the memory identifier bit MID that identifies each of the semiconductor memory devices 200, the optical control code OCD of each of the semiconductor memory devices 200 and the desired (or, alternatively, optimal) equalization coefficients OEC of each of the semiconductor memory devices 200. The memory identifier bit MID may include identifiers ID1~IDt of the semiconductor memory devices 200, the desired (or, alternatively, optimal) equalization coefficients OEC may include desired (or, alternatively, optimal) equalization coefficients OEC1~OECt of the semiconductor memory devices 200 and the optical control code OCD may include optical control codes OCD1~OCDt of the semiconductor memory devices 200.

Figure 18:
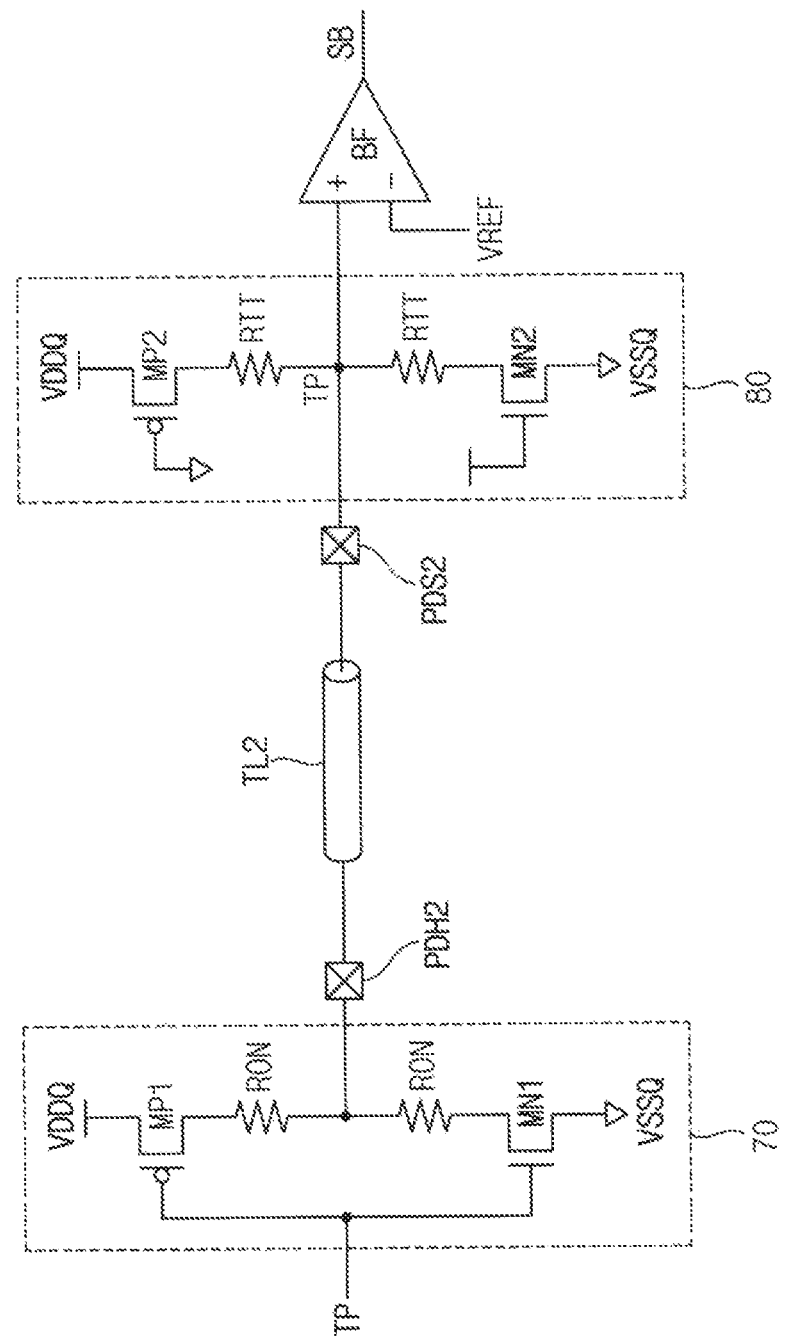
FIG. 18 is a diagram for describing a center-tapped termination.

FIG. 18 is a diagram for describing a center-tapped termination (CTT).

Referring to FIG. 18, a transmission driver 70 in a memory controller may drive a pad PDH2 based on the training pattern TP from an internal circuit. The pad PDH2 in the memory controller may be connected to a pad PDS2 of a semiconductor memory device through a transmission line TL2. A termination circuit 80 of the CTT scheme may be connected to the PDS2 of the semiconductor memory device for impedance matching. The reception buffer BF in the semiconductor memory device may compare the training pattern TP through the pad PDS2 with the reference voltage VREF to provide the buffer signal SB to an internal circuit of the semiconductor memory device.

The transmission driver 70 may include a pull-up unit connected between a first power supply voltage VDDQ and the pad PDH2 and a pull-down unit connected between the pad PDH2 and a second power supply voltage VSSQ lower than the first power supply voltage VDDQ. The pull-up unit may include a turn-on resistor RON and a PMOS transistor MP1 that is switched in response to the training pattern TP. The pull-down unit may include a turn-on resistor RON and an NMOS transistor MN1 that is switched in response to the training pattern TP. The turn-on resistors RON may be omitted and each turn-on resistor RON may represent a resistance between the voltage node and the pad PDH2 when each of the transistors MP1 and MN1 is turned on.

The termination circuit 80 of the CTT scheme may include a first sub termination circuit connected between the first power supply voltage VDDQ and the pad PDS2 and a second sub termination circuit connected between the pad PDS2 and the second power supply voltage VSSQ. The first sub termination circuit may include a termination resistor RTT and a PMOS transistor MP2 that is turned on in response to a low voltage. The second sub termination circuit may include a termination resistor RTT and an NMOS transistor MN2 that is turned on in response to a high voltage. The termination resistors RTT may be omitted and each termination resistor RTT may represent a resistance between the voltage node and the pad PDSs when each of the transistors MP2 and MN2 is turned on.

Figure 19:
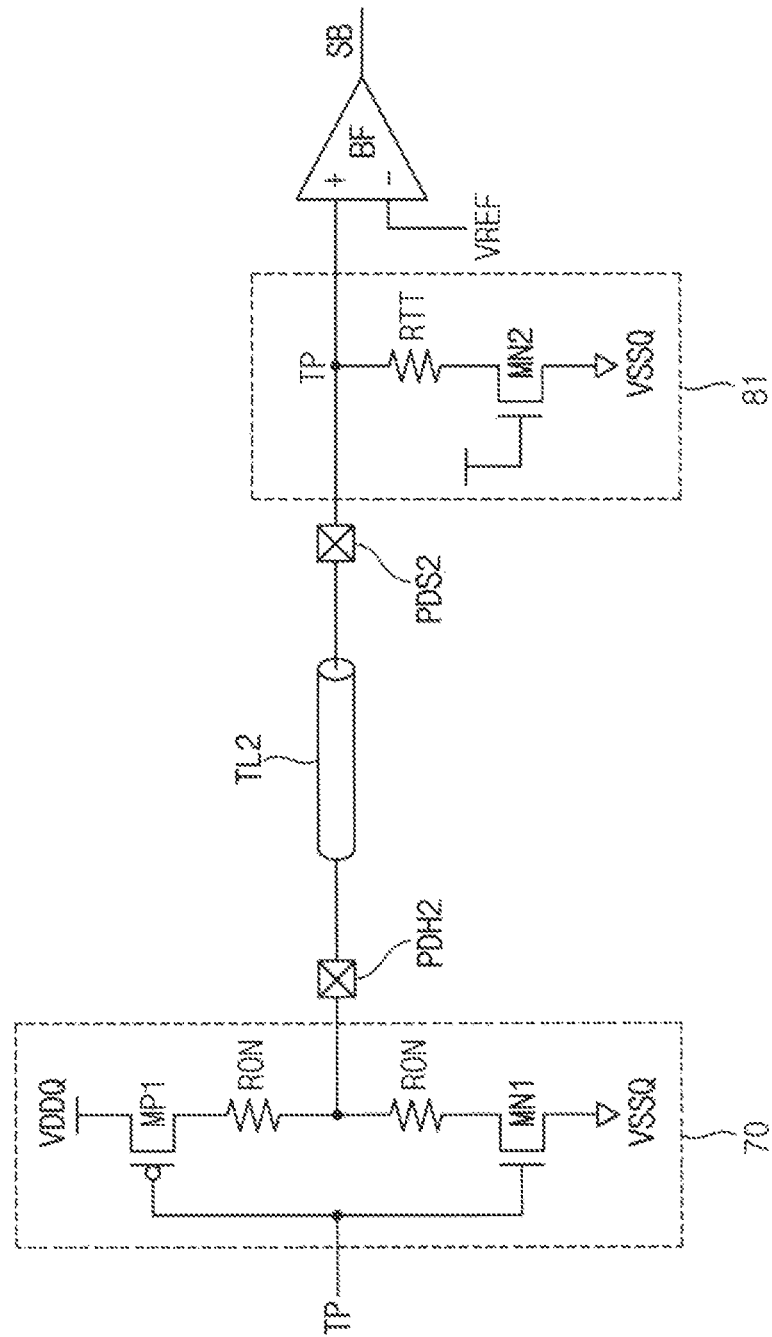
FIG. 19 is a diagram for describing a pseudo-open drain termination.

FIG. 19 is a diagram for describing a pseudo-open drain (POD) termination.

Referring to FIG. 19, description on the transmission driver 70 is the same as in FIG. 18.

The termination circuit 81 of the POD termination scheme may include a termination resistor RTT and an NMOS transistor MN2 that is turned on in response to a high voltage. The termination resistor RTT may be omitted and the termination resistor RTT may represent a resistance between the voltage node and the pad PDS2 when the NMOS transistor MN2 is turned on.

On-die termination resistance of each of the semiconductor memory devices 201a~201e, 202a~202e, 203a~203e, and 204a~204e in the memory module 100 of FIG. 2 or in the memory module 100a of FIG. 15 may set equally with respect to one another in the training mode.

Figure 20:
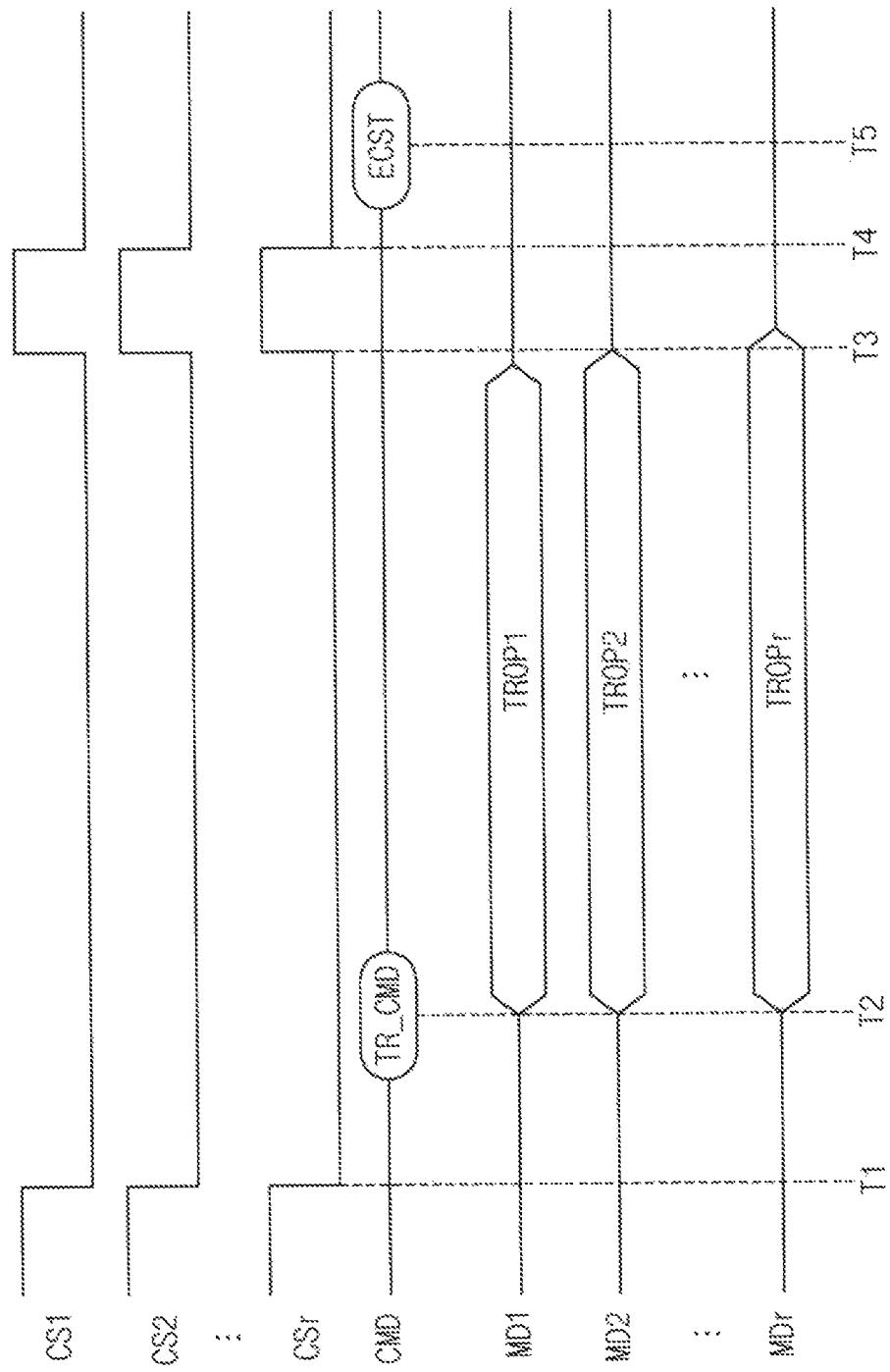
FIG. 20 is a timing diagram illustrating an example of a training operation of the memory module of FIG. 2 or the memory module of FIG. 15.

FIG. 20 is a timing diagram illustrating an example of a training operation of the memory module of FIG. 2 or the memory module of FIG. 15.

In FIG. 20, it is assumed that one rank in the memory module 100 of FIG. 2 or in the memory module 100 of FIG. 15 may include r semiconductor memory devices. Here r is an integer greater than one.

Referring to FIG. 20, at a timing point T1, the memory controller 25 enables chip selection signals CS1~CSr with a logic low level, which are applied to semiconductor memory devices 200 respectively. When the chip selection signals CS1~CSr are enabled, the semiconductor memory devices 200 are simultaneously selected and are activated.

At a timing point T2, the memory controller 25 may simultaneously apply, to the semiconductor memory devices 200, the training command TR_CMD to directs training of the control equalization coefficients CEC of the equalizer 410 and the training pattern TP. Between timing points T2 and T3, the reception interface circuit 400a in each of the semiconductor memory devices 200 simultaneously perform training TROP1~TROPr to search the desired (or, alternatively, optimal) equalization coefficients OEC by equalizing the training pattern TP based on the control equalization coefficients CEC, the semiconductor memory device 200 individually finishes the training TROP1~TROPr around the timing point T3. A timing point at which the training is finished may be different among the semiconductor memory device 200. The semiconductor memory device 200 may transmit the training information signal TIS to the memory controller 25 respectively before the training is finished.

At the timing point T3, the training is finished and the memory controller 25 disables the chip selection signals CS1~CSr with a logic high level. At a timing point T4, the memory controller 25 enables the chip selection signals CS1~CSr with a logic low level and the semiconductor memory devices 200 are enabled. At a timing point T5, the memory controller 25 applies an equalization coefficient setting command ECST indication an end of the training mode to the semiconductor memory devices 200. In response to the equalization coefficient setting command ECST, the semiconductor memory devices 200 disable the mode signal MS to indicate the normal mode.

Figure 21:
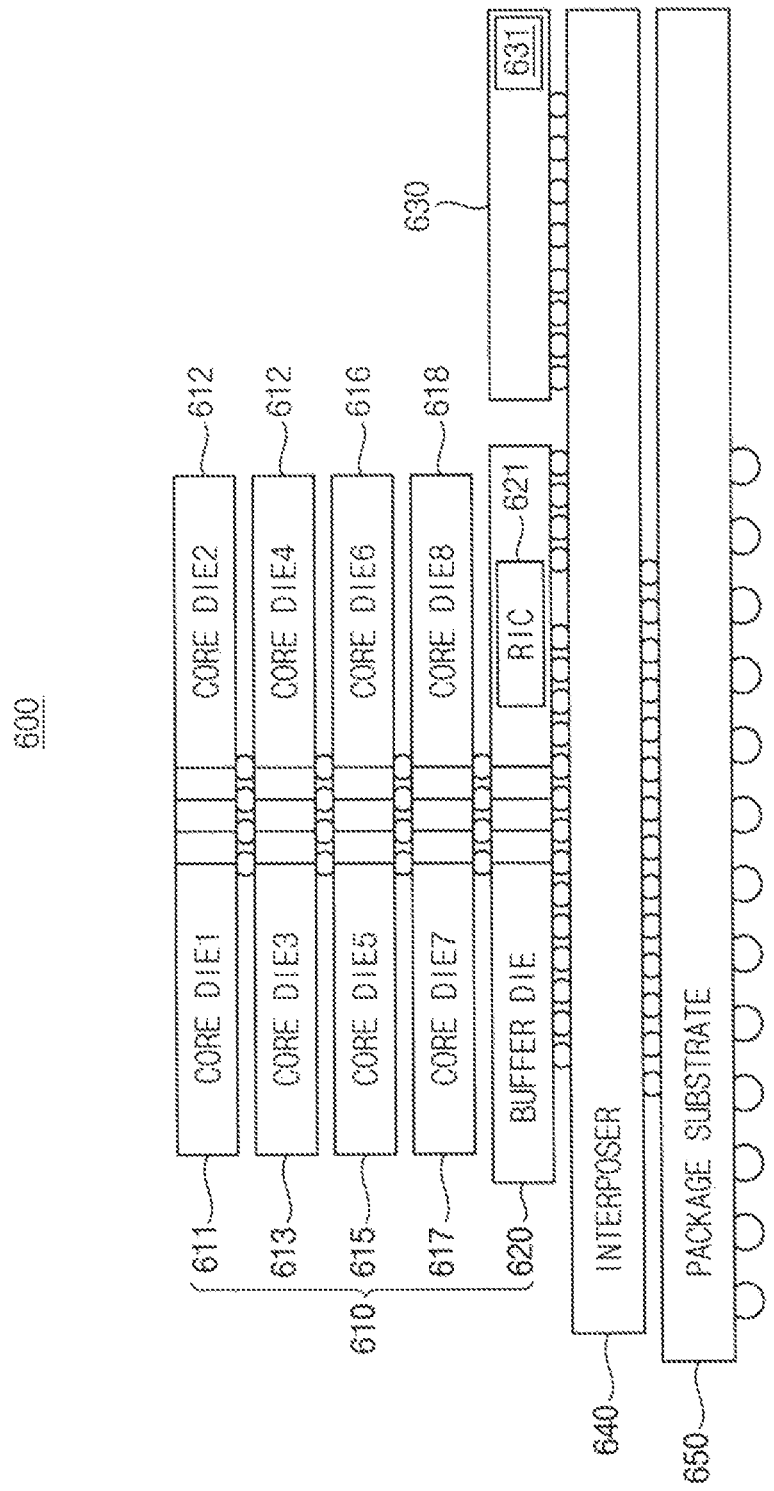
FIG. 21 is a block diagram illustrating a memory system according to example embodiments.

FIG. 21 is a block diagram illustrating a memory system according to example embodiments.

Referring to FIG. 21, a memory system 600 may include a semiconductor memory device 610, a system-on-chip (SoC) 630, an interposer 640, and a package substrate 650. The SoC 630 may include a memory controller 631

The semiconductor memory device 610 may be a high-bandwidth memory (HBM) device, and may include a buffer die 620 and first to eighth core dies 611 to 618. The buffer die 620 and the first to eighth core dies 611 to 618 may be connected to each other via through silicon vias.

The buffer die 620 may include a reception interface circuit 621, may perform the training to search the desired (or, alternatively, optimal) equalization coefficients in the training mode and may transmit the training information signal including the desired (or, alternatively, optimal) equalization coefficients to the memory controller 631. The reception interface circuit 621 may employ the reception interface circuit 400a in FIG. 6 or the reception interface circuit 520 in FIG. 13

The interposer 640 connects the SoC 630 and the buffer die 620 to each other using a wire. The package substrate 650 supports the SoC 30 and the semiconductor memory device 610, and connects the SoC 630 and the semiconductor memory device 610 to a mother board.

The semiconductor memory device 610 may replace each of the semiconductor memory devices 201a~201e, 202a~202e, 203a~203e, and 204a~204e. Therefore, in a memory module including the semiconductor memory devices 610, the semiconductor memory devices 610 perform training simultaneously and transmit results of the training to the memory controller in the training mode. Therefore, the memory module including the semiconductor memory devices 610 may greatly reduce time for the training.

Figure 22:
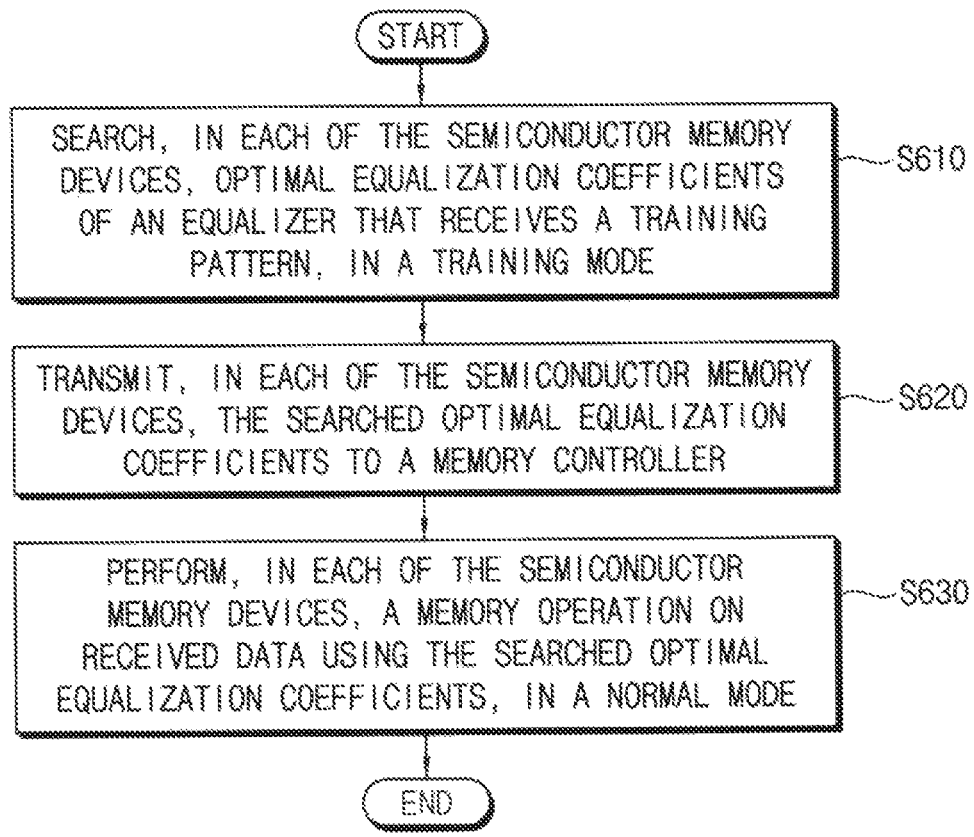
FIG. 22 is a flow chart illustrating a method of operation a memory module according to example embodiments.

FIG. 22 is a flow chart illustrating a method of operation a memory module according to example embodiments.

Referring to FIGS. 1 through 22, a memory module 100 may include a plurality of semiconductor memory devices 200 mounted on a module board 101.

In operation S610, each of the semiconductor memory devices 200 may search for desired (or, alternatively, optimal) equalization coefficients OEC of an equalizer 410 that receives a training pattern TP in a training mode, in response to a training command TR_CMD from a memory controller 25.

In operation S620, each of the semiconductor memory devices 200 may transmit the searched desired (or, alternatively, optimal) equalization coefficients OEC to the memory controller 25.

In operation S630, each of the semiconductor memory devices 200 may perform a memory operation based on data receive from the memory controller 52 by using the desired (or, alternatively, optimal) equalization coefficients OEC, in a normal mode.

Therefore, in a method of operating the memory module, the semiconductor memory devices may perform training simultaneously and transmit results of the training to the memory controller in the training mode. Therefore, according to the method, time for the training may be greatly reduced.

Figure 23:
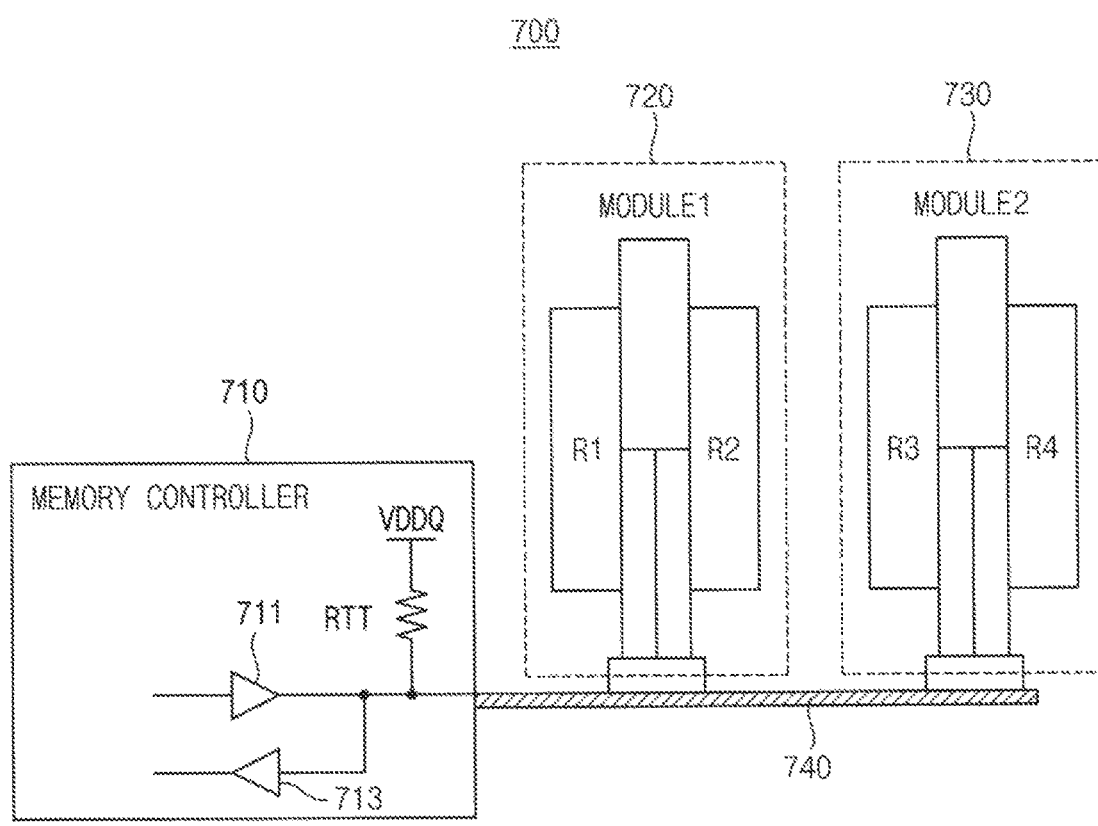
FIG. 23 is a block diagram illustrating a memory system having quad-rank memory modules according to example embodiments.

FIG. 23 is a block diagram illustrating a memory system having quad-rank memory modules according to example embodiments.

Referring to FIG. 23, a memory system 700 may include a memory controller 710 and at least one or more memory modules 720 and 730. The memory controller 710 may include a transmission driver 711 and a reception driver 713.

The memory controller 710 may control the memory modules 720 and 730 so as to perform a command supplied from a processor or host. The memory controller 710 may be implemented in a processor or host or may be implemented with an application processor or a system-on-chip (SOC).

For signal integrity, a source termination may be implemented with a resistor RTT on a bus 740 of the memory controller 710. The resistor RTT is connected to a power supply voltage VDDQ.

The first memory module 720 and the second memory module 730 may be coupled to the memory controller 710 through the bus 740. Each of the first memory module 720 and the second memory modules 730 may be the memory module 100 of FIG. 2 or the memory module 100a of FIG. 15. The first memory module 720 may include at least one or more memory ranks RNK1 and RNK2, and the second memory module 730 may include one or more memory ranks RNK3 and RNK4. Each of the first memory module 720 and the second memory module 730 may the memory module 100 of FIG. 2 or the memory module 100a of FIG. 15 and may perform the above-mentioned training on the semiconductor memory devices by unit of a rank simultaneously.

Figure 24:
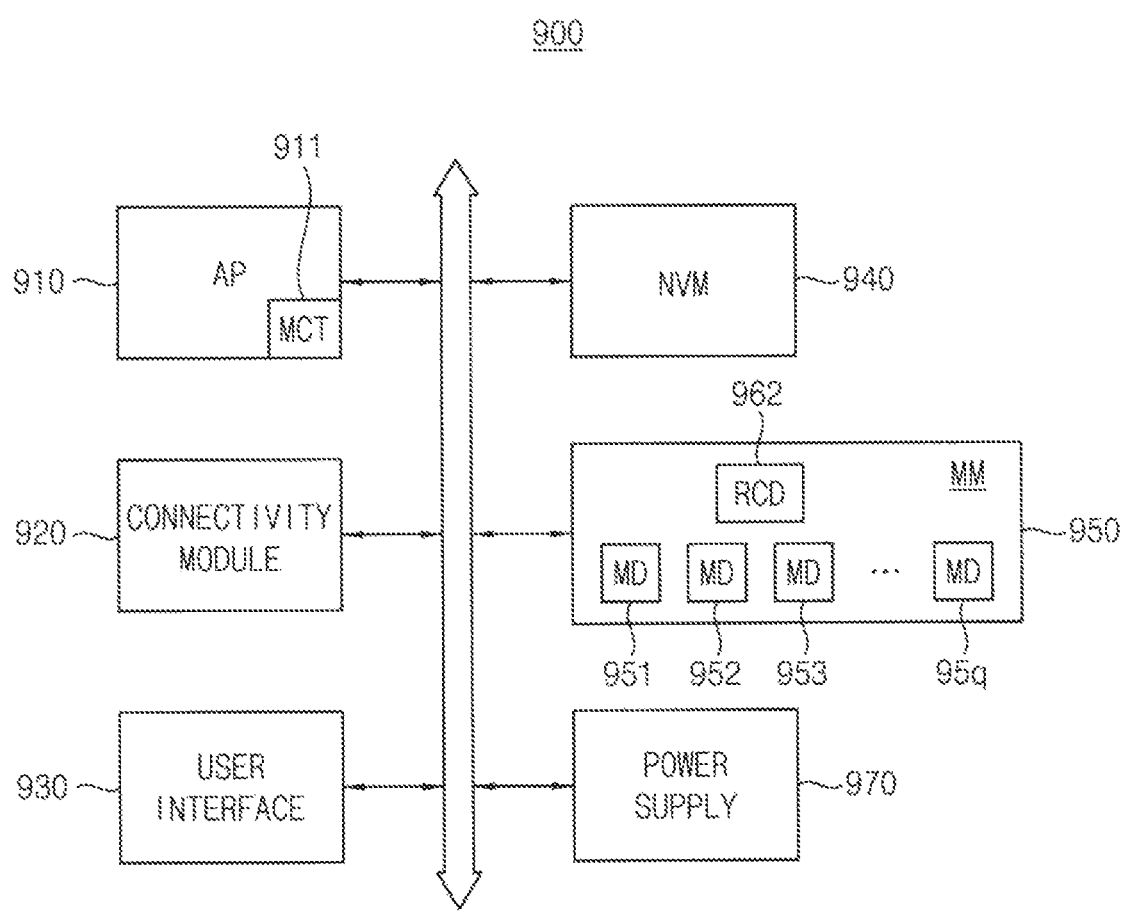
FIG. 24 is a block diagram illustrating a mobile system including the memory module according to example embodiments.

FIG. 24 is a block diagram illustrating a mobile system including the memory module according to example embodiments.

Referring to FIG. 24, a mobile system 900 may include an application processor 910, a connectivity module 920, a memory module 950, a nonvolatile memory device 940, a user interface 930 and a power supply 970. The application processor 910 may include a memory controller 911.

The application processor 910 may execute applications, such as a web browser, a game application, a video player, etc. The connectivity module 920 may perform wired or wireless communication with an external device.

The memory module 950 may store data processed by the application processor 910 or operate as a working memory. The memory module 950 may include a plurality of semiconductor memory devices 951~95q (q is a natural number greater than three) and a control device 962. Each of the semiconductor memory devices 951~95q may include the reception interface circuit 400a in FIG. 6 or the reception interface circuit 520 in FIG. 13.

The nonvolatile memory device 940 may store a boot image for booting the mobile system 900. The user interface 930 may include at least one input device, such as a keypad, a touch screen, etc., and at least one output device, such as a speaker, a display device, etc. The power supply 970 may supply an operating voltage to the mobile system 900.

In some embodiments, the mobile system 900 and/or components of the mobile system 900 may be packaged in various forms.

Example embodiments may be applied to systems using memory modules.

According to one or more example embodiments, the units and/or devices described above including elements of the each of the plurality of semiconductor memory devices 200 such as elements of the control logic circuit 210 and the reception interface circuit 400a including the self-training circuit 430 and one or more other components discussed above may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

The foregoing is illustrative of example embodiments of the present inventive concepts and is not to be construed as limiting thereof. Although a few example embodiments have been described, those skilled in the art will readily appreciate that many modifications are possible in the example embodiments without materially departing from the novel teachings and advantages of the example embodiments of the present inventive concepts. Accordingly, all such modifications are intended to be included within the scope of the example embodiments of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory module comprising:
a plurality of semiconductor memory devices associated with a same module board, each of the plurality of semiconductor memory devices including a memory cell array that includes a plurality of dynamic memory cells, the plurality of semiconductor memory devices configured to simultaneously perform a training operation, the plurality of semiconductor memory devices including a reception interface circuit configured to,
perform the training operation to search for selected equalization coefficients of an equalizer based on a training pattern from a memory controller, and
transmit a training information signal to the memory controller in a training mode in response to a training command from the memory controller, the training information signal including the selected equalization coefficients, wherein the reception interface circuit includes, the equalizer configured to generate an equalizer output pattern by equalizing the training pattern based on control equalization coefficients in the training mode; and a self-training circuit configured to provide the control equalization coefficients to the equalizer, the self-training circuit configured to, generate an error counting value that indicates a difference between the equalizer output pattern and a reference pattern, and adaptively adjust searching equalization coefficients to provide the control equalization coefficients to the equalizer based on the error counting value and a reference value, and wherein the equalizer utilizes the searching equalization coefficients to search for the selected equalization coefficients.

2. The memory module of claim 1, wherein the plurality of semiconductor memory devices are configured to perform the training operation simultaneously by rank unit of the plurality of semiconductor memory devices.

3. The memory module of claim 1, wherein the equalizer includes at least one of a continuous time linear equalizer, a feed-forward equalizer and a decision feedback equalizer.

4. The memory module of claim 1, wherein the equalizer includes a continuous time linear equalizer and a feed-forward equalizer connected to the continuous time linear equalizer.

5. The memory module of claim 1, wherein the self-training circuit is configured to, store the reference pattern in a register associated with the self-training circuit, generate a comparison signal based on the equalizer output pattern and the reference pattern, and output the error counting value in response to the comparison signal.

6. The memory module of claim 1, wherein the self-training circuit is configured to, output the reference pattern via a replica path in response to the training pattern, the replica path replicating a path that provides the equalizer output pattern while being independent from an external influence, generate a comparison signal based on the equalizer output pattern and the reference pattern, and output the error counting value in response to the comparison signal.

7. The memory module of claim 1, wherein the self-training circuit is configured to, output an adaptive coefficient control signal based on the error counting value and the reference value, provide the equalizer with the searching equalization coefficients as the control equalization coefficients in response to the adaptive coefficient control signal such that the adaptive coefficient control signal instructs a controller associated with the self-training circuit to reduce a difference between the error counting value and the reference value, and output the searching equalization coefficient as the selected equalization coefficients in response to the difference between the error counting value and the reference value reaching a lower threshold value.

8. The memory module of claim 7, wherein the controller is configured to output a flag signal including a pass/fail bit and a memory identifier bit when the adaptive coefficient control signal indicates the difference between the error counting value and the reference value reaches the lower threshold value, the pass/fail bit indicating whether the training operation is successful for a corresponding one of the plurality of semiconductor memory devices and the memory identifier bit indicating the corresponding one of the plurality of semiconductor memory devices.

9. The memory module of claim 7, wherein the self-training circuit configured is configured to reduce the difference between the error counting value and the reference value using one of a zero forcing algorithm, a least mean square algorithm and a recursive least square algorithm.

10. The memory module of claim 1, wherein the reception interface circuit further includes a demultiplexer configured to, provide the self-training circuit with the equalizer output pattern from the equalizer in the training mode, and provide an internal circuit with an output of the equalizer in response to data received from the memory controller in a normal mode, wherein the memory module switches between the training mode and the normal mode in response to a mode signal.

11. The memory module of claim 1, wherein the self-training circuit further includes a register configured to store the control equalization coefficients, and the self-training circuit is configured to transmit the control equalization coefficients as the selected equalization coefficients to the memory controller in response to a difference between the error counting value and the reference value reaching a lower threshold value.

12. The memory module of claim 1, wherein each of the semiconductor memory devices is configured to:

receive the selected equalization coefficients and a flag signal in response to a difference between the error counting value and the reference value reaching a lower threshold value, the flag signal including a pass/fail bit and a memory identifier bit, the pass/fail bit indicating a pass or a fail of the training operation and the memory identifier bit identifying a corresponding semiconductor memory device; and transmit, to the memory controller, the training information signal that further includes the selected equalization coefficients and the flag signal.

13. The memory module of claim 1, wherein each of the semiconductor memory devices further comprises a signal merger, and wherein the signal merger is configured to:

receive the control equalization coefficients as the selected equalization coefficients when a difference between the error counting value and the reference value becomes a minimum value, receive a flag signal including a pass/fail bit and a memory identifier bit, the pass/fail bit indicating whether the training operation is successful for a corresponding one of the plurality of semiconductor memory devices and the memory identifier bit identifying the corresponding one of the plurality of semiconductor memory devices, and merge the training information signal with the selected equalization coefficients and the flag signal to generate a merged training information signal, wherein the memory module further comprises:

a control device configured to receive the merged training information signal from each of the semiconductor memory devices, and to transmit the merged training information signal to the memory controller.

14. The memory module of claim 13, wherein the control device includes a memory configured to store the merged training information signal for each of the semiconductor memory devices.

15. The memory module of claim 1, wherein the reception interface circuit is further configured to,
   compare the training pattern with a reference voltage to output a comparison signal,
   generate the reference voltage in response to a control code,
   search for the control code corresponding to a desired voltage level of the reference voltage in the training mode, and
   output the control code in a normal mode.

16. The memory module of claim 1, wherein each of the semiconductor memory devices further comprises:
   a temperature sensor configured to,
      sense an operating temperature of a corresponding semiconductor memory device; and
      transmit a training request signal to the memory controller in response to the operating temperature being greater than a reference temperature, the training request signal requesting the training operation of the corresponding semiconductor memory device, wherein
         the reception interface circuit of each of the plurality of semiconductor memory devices is configured to set on-die termination resistance of equally with respect to each other in the training mode, and
         each of the semiconductor memory devices includes a double data rate 5 (DDR5) synchronous dynamic random access memory (SDRAM).

17. A memory system comprising:
   a memory controller; and
   a memory module including a plurality of semiconductor memory devices, each of the plurality of semiconductor memory devices including a memory cell array that includes a plurality of dynamic memory cells, the plurality of semiconductor memory devices configured to simultaneously perform a training operation, the plurality of semiconductor memory devices including a reception interface circuit configured to,
      perform the training operation to search for selected equalization coefficients of an equalizer based on a training pattern received from the memory controller, and
      transmit a training information signal to the memory controller in a training mode in response to a training command from the memory controller, the training information signal including the selected equalization coefficients,
      wherein the reception interface circuit includes,
         the equalizer configured to generate an equalizer output pattern by equalizing the training pattern based on control equalization coefficients in the training mode; and
         a self-training circuit configured to provide the control equalization coefficients to the equalizer, the self-training circuit configured to,
            generate an error counting value that indicates a difference between the equalizer output pattern and a reference pattern, and
            adaptively adjust searching equalization coefficients to provide the control equalization coefficients to the equalizer based on the error counting value and a reference value, and
         wherein the equalizer utilizes the searching equalization coefficients to search for the selected equalization coefficients.

18. The memory system of claim 17, wherein the plurality of semiconductor memory devices is configured to,
   merge the training information signal with selected equalization coefficients and a flag signal to generate a merged training information signal, the flag signal including a pass/fail bit and a memory identifier bit, the pass/fail bit indicating whether the training operation is successful for a corresponding one of the plurality of semiconductor memory devices and the memory identifier bit indicating the corresponding one of the plurality of semiconductor memory devices, and
   transmit the training information signal to each of the plurality of semiconductor memory devices, wherein
      the memory controller includes a training information storage table configured to store the merged training information signal for each of the semiconductor memory devices.

19. A method of operating a memory module, the memory module including a plurality of semiconductor memory devices, each of the plurality of semiconductor memory devices including a memory cell array that includes a plurality of dynamic memory cells, the method comprising:
   simultaneously performing, by a reception interface circuit included in each of the semiconductor memory devices operating in a training mode, a training operation to search for selected equalization coefficients of an equalizer based on a training pattern received from a memory controller;
   transmitting, by each of the plurality of semiconductor memory devices, the selected equalization coefficients to the memory controller; and
   performing, by each of the plurality of semiconductor memory devices operating in a normal mode, a memory operation on data received from the memory controller using the selected equalization coefficients,
   wherein the reception interface circuit includes,
      the equalizer configured to generate an equalizer output pattern by equalizing the training pattern based on control equalization coefficients in the training mode; and
      a self-training circuit configured to provide the control equalization coefficients to the equalizer, the self-training circuit configured to,
         generate an error counting value that indicates a difference between the equalizer output pattern and a reference pattern, and
         adaptively adjust searching equalization coefficients to provide the control equalization coefficients to the equalizer based on the error counting value and a reference value, and
      wherein the equalizer utilizes the searching equalization coefficients to search for the selected equalization coefficients.

* * * * *